US 6,551,846 B1

(12) United States Patent
Furutani et al.

(10) Patent No.: US 6,551,846 B1
(45) Date of Patent: Apr. 22, 2003

(54) SEMICONDUCTOR MEMORY DEVICE CAPABLE OF CORRECTLY AND SURELY EFFECTING VOLTAGE STRESS ACCELERATION

(75) Inventors: Kiyohiro Furutani, Hyogo (JP); Mikio Asakura, Hyogo (JP); Tetsuo Katoh, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 190 days.

(21) Appl. No.: 09/642,751

(22) Filed: Aug. 18, 2000

(30) Foreign Application Priority Data

Aug. 30, 1999  (JP) ............................................ 11-243211

(51) Int. Cl.$^7$ .......................... G01R 31/26; H01L 21/66
(52) U.S. Cl. ......................... 438/17; 438/17; 438/239; 438/244; 438/250; 438/253; 257/68; 257/71; 257/905; 257/906; 257/907; 257/908; 257/48; 716/18
(58) Field of Search ........................... 438/17, 239–244, 438/250, 253; 257/68–71, 905–908, 48; 716/18

(56) References Cited

U.S. PATENT DOCUMENTS

| 5,287,312 | A | * | 2/1994 | Okamura et al. ............. 365/201 |
| 5,357,193 | A | * | 10/1994 | Tanaka et al. ............. 324/158.1 |
| 5,381,373 | A | * | 1/1995 | Ohsawa ........................ 365/201 |
| 5,856,951 | A | * | 1/1999 | Arimoto et al. .............. 365/226 |
| 6,038,183 | A | * | 3/2000 | Tsukude ....................... 365/201 |
| 6,052,324 | A | * | 4/2000 | Tobita ......................... 365/207 |
| 6,064,621 | A | * | 5/2000 | Tanizaki et al. .......... 365/230.03 |
| 6,151,244 | A | * | 11/2000 | Fujino et al. ................ 365/149 |
| 6,222,774 | B1 | * | 4/2001 | Tanzawa et al. .......... 365/185.29 |
| 6,230,280 | B1 | * | 5/2001 | Okasaka ...................... 713/400 |
| 6,297,624 | B1 | * | 10/2001 | Mitsui et al. ................ 323/316 |
| 6,310,815 | B1 | * | 10/2001 | Yamagata et al. ....... 365/230.03 |
| 6,333,879 | B1 | * | 12/2001 | Kato et al. ................... 365/201 |

FOREIGN PATENT DOCUMENTS

| JP | 6-28893 | 2/1994 |
| JP | 6-325597 | 11/1994 |
| JP | 10-199298 | 7/1998 |

OTHER PUBLICATIONS

Tomita et al., "A 62–ns 16mb cmos eprom with voltage stress relaxation technique" Ieee Journal of solid–state circuits vol. 26 No. 11 11/99 p. 1593–1599.*

"Flexible Test Mode Design for DRAM Characterization", H. Wong et al., 1996 Symposium on VLSI Circuits Digest of Technical Papers, pp. 194–195.

* cited by examiner

Primary Examiner—Matthew Smith
Assistant Examiner—Granvill D Lee, Jr.
(74) Attorney, Agent, or Firm—McDermott, Will & Emery

(57) ABSTRACT

A test signal generating circuit generates internal test control signals from a small number of signals supplied via an address terminal in a test mode operation. According to the test control signals, the values of internal row address signal bits from an address buffer are set, while a row-related control circuit with test control function controls operations of a row selection circuit and bit line peripheral circuitry according to the test control signals. A plurality of word lines are driven simultaneously into a selected state and an acceleration test is performed according to a small number of control signals in a short period of time. Voltage stress applied between memory cell capacitors and between word lines can be accelerated with a small number of control signals.

7 Claims, 17 Drawing Sheets (DETECT TIMING RELATION)

| OPERATION | φ0 | φ1 | φ2 | SELECTED PREDECODE SIGNAL |
|---|---|---|---|---|
| 1 | H | H | L | X<0> ~ X<3> |
| 2 | L | H | H | X<0> , X<3> |
| 3 | H | L | H | X<0> , X<2> |
| 4, 5 | H | H | H | X<0> — X<3> |
|  | L | H | L | X<1> , X<3> |
|  | H | L | L | X<0> , X<2> |

SEMICONDUCTOR MEMORY DEVICE CAPABLE OF CORRECTLY AND SURELY EFFECTING VOLTAGE STRESS ACCELERATION

BACKGROUND OF THE INVENTION

1. Field of the Invention

The present invention relates to semiconductor memory devices, and particularly to a structure for applying voltage stress between memory cells in a dynamic semiconductor memory device. More particularly, the invention relates to a structure for applying voltage stress between adjacent memory cell capacitors using a small number of signals.

2. Description of the Background Art

An acceleration test called burn-in test is performed for removing, from produced devices, any device having a short life time so as to ship the remaining ones. In this acceleration test, the produced devices are operated for a certain period of time under conditions severer than actual conditions in use, and any device having a short life time is broken. In other words, this acceleration test uses stress acceleration to reveal any potential defect which was not detected in a normal failure detection test.

Concerning a dynamic semiconductor memory device (hereinafter referred to as DRAM), the most important test is the burn-in test applied to memory cells accounting for a large percentage of elements on the device. However, with the remarkable increase in the storage capacity of the DRAM, only a small part of the total memory cells operates in one normal operating cycle of the DRAM. The number of memory cells connected to one word line is limited and the number of word lines selected in a normal operation at a time is determined by the refresh cycle. For example, in a 256M DRAM with 8K refresh cycle, only $1/8192$ (8K) of the total memory cells are selected in one normal operation cycle. In order to perform a burn-in test on all the memory cells, a memory cell row should be selected 8K times, which causes increase of time required for the burn-in test.

"1996 Symposium on VLSI Circuits, Digest of Technical Papers" discloses on pages 194 and 195, for example, a structure in which a greater number of word lines are selected simultaneously and accordingly a greater number of memory cells are selected than in a normal operation, in order to shorten the time required to do the burn-in test.

FIG. 25 is a schematic diagram illustrating a word line drive control unit disclosed in the document above. In FIG. 25, the word line drive control unit includes a block decoder 500 receiving test mode row decoder latch instruction signal TM_RDLTC and a row address signal RowAddr, a level shifter 501 boosting H level of an output signal of block decoder 500 to generate a block selection signal BLKSEL, a word line (WL) reset circuit 502 receiving test mode word line latch instruction signal TM_WLLTC, test mode word line reset instruction signal TM_WLRST and an internal row address strobe signal RAS, a level shifter 503 receiving a word line activation instruction signal WLON, a predecode signal X12 and a word line inactivation instruction signal WLOFF from WL reset circuit 502 to generate a word line activation timing signal and a word line reset timing signal, a buffer circuit 504 buffering the timing signals from level shifter 503 to generate a word line drive signal WLDV, and an NOR circuit 505 receiving the timing signals from level shifter 503 and word line drive signal WLDV from buffer circuit 504 to generate a word line reset signal WLRST.

When test mode row decoder latch instruction signal TM_RDLTC attains the active state, block decoder 500 maintains its set state without being reset regardless of the state of row address signal RowAddr, and fixes block selection signal BLKSEL at H level (when a memory block is selected).

In a normal operation mode, WL reset circuit 502 drives word line reset timing signal WLOFF into the active state according to internal row address strobe signal RAS. In a test mode, WL reset circuit 502 maintains word line reset timing signal WLOFF in the inactive state during the period in which test mode word line latch instruction signal TM_WLLTC is in the active state, and drives word line reset timing signal WLOFF into the active state when test mode word line reset instruction signal TM_WLRST is supplied.

Level shifter 503 receives word line activation timing signal WLON and predecode signal X12 to generate a word line drive timing signal in the active state according to word line activation timing signal WLON when predecode signal X12 is in the active state. Level shifter 503 maintains this state until word line reset timing signal WLOFF is activated.

NOR circuit 505 drives word line reset signal WLRST into the active state of H level when word line drive signal WLDV reaches the inactive state and an output signal of level shifter 503 attains L level. During the period in which word line drive signal WLDV is in the active state of H level, NOR circuit 505 maintains word line reset signal WLRST in the inactive state of L level.

The word line drive control unit further includes a decode circuit 506a corresponding to a word line WLi+1, being activated in response to activation of block selection signal BLKSEL from level shifter 501 and decoding predecode signals XAij and XAkl, a latch circuit 507a inverting and latching an output signal of decode circuit 506a, a word line drive circuit 508a transmitting word line drive signal WLDV to the associated word line WLi+1 when an output signal of latch circuit 507a is in the active state of L level, and a reset transistor 509a responsive to activation of word line reset signal WLRST for resetting word line WLi+1 to the ground voltage level.

Similarly, a decode circuit 506b activated in response to activation of block selection signal BLKSEL to decode predecode signals XAij and XAkl, a latch circuit 507b inverting and latching an output signal of decode circuit 506b, a word line drive circuit 508b transmitting word line drive signal WLDV to an associated word line WLi when an output signal of latch circuit 507b is in the active state of L level, and a reset transistor 509b which is turned on when word line reset signal WLRST is activated to reset word line WLi to the ground voltage level are provided corresponding to word line WLi.

Different combinations of predecode signals are respectively provided to decode circuits 506a and 506b. In a memory block selected by block selection signal BLKSEL, one word line is selected from a group of word lines selected by predecode signal X12 according to predecode signals XAij and XAkl. An operation in a test mode of the word line drive control unit shown in FIG. 25 is now described in conjunction with the signal waveform diagram illustrated in FIG. 26.

In the test mode, test mode instruction signal TM is first activated and simultaneously test mode row decoder latch instruction signal TM_RDLTC and test mode word line latch instruction signal TM_WLLTC are driven into the active state. Accordingly, block decoder 500 is set into a latching state and WL reset circuit 502 is set into a latching state.

In this test mode setting, word line activation timing signal WLON is in the inactive state, word line activation timing signal from level shifter 503 is at L level, word line drive signal WLDV is at L level, word line reset signal WLRST is at H level, and word lines WLi+1 and WLi are maintained at L level. Since no row address is supplied, block selection signal BLKSEL from level shifter 501 is at L level.

In this test mode, externally supplied row address strobe signal /RAS is driven into the active state of L level and simultaneously a row address signal is supplied. According to the row address signal, block decoder 500 is selected, an output signal of block decoder 500 rises to H level, and the H level is latched according to test mode row decoder latch instruction signal TM_RDLTC. Thus, block selection signal BLKSEL from level shifter 501 is fixed at H level in this test mode period. Block selection signal BLKSEL is fixed at H level and decode circuits 506a and 506b are activated.

According to externally supplied row address strobe signal /RAS, internal row address strobe signal RAS is activated and accordingly word line drive timing signal WLON is activated. According to the supplied row address signal, predecode signals XAij, XAkl and X12 are generated and a designated word line (word line WL1 in FIG. 26) is driven into the selected state. Remaining word lines are in the non-selected state.

External row address strobe signal /RAS is temporarily set in the inactive state. At this time, internal row address strobe signal RAS is also inactivated. However, in response to activation of test mode word line latch instruction signal TM_WLLTC, WL reset circuit 502 maintains word line reset timing signal WLOFF in the inactive state. A timing signal from level shifter 503 thus maintains H level and selected word line WL1 maintains the selected state.

Externally supplied row address strobe signal /RAS is driven into the active state again, and another row address is supplied to drive another word line into the selected state. When the another word line WL2 is driven into the selected state, previously selected word line WL1 maintains its selected state. Subsequently, external row address strobe signal /RAS is toggled and a row address is simultaneously supplied so that a plurality of word lines are driven simultaneously into the selected state.

With the plurality of word lines maintained in the selected state, the voltage level of word line drive signal WLDV is raised to effect acceleration of voltage stress of a gate insulating film of memory cell transistors connected to word line WL.

When the test mode is completed, test mode instruction signal TM is inactivated and simultaneously test mode word line reset signal TM_WLRST is activated. In this way, WL reset circuit 502 is activated and word line reset timing signal WLOFF is activated. Responsively, level shifter 503 is reset, the word line drive timing signal is set into the inactive state of L level and word line drive signal WLDV is driven into L level. Word line reset signal WLRST from NOR circuit 505 reaches the active state of H level, reset transistors 509a and 509b are turned on and word lines WLi and WLi+1 (WL1, WL2) are driven into the non-selected state.

When the test mode is reset, test mode row decoder latch instruction signal TM_RDLTC is accordingly driven into the non-selected state, block decoder 500 is reset, block selection signal BLKSEL from level shifter 501 is set into the non-selected state of L level, and decode circuits 506a and 506b are inactivated.

In this test mode, block selection signal BLKSEL is fixed at H level so that row decode circuits 506a and 506b are not reset even if predecode signals XAij and XAkl change. At this time, a decoding operation is carried out and the result of the decoding is latched by latch circuits 507a and 507b merely, and a word line which is selected once maintains the selected state during this test mode.

An acceleration test is carried out with a plurality of word lines maintained in the selected state. Consequently, the time required for the acceleration test can remarkably be decreased compared with the case in which one word line is selected to perform the acceleration test.

FIG. 27 is a schematic diagram illustrating a structure of bit line peripheral circuitry of the semiconductor memory device disclosed in the document mentioned above. Referring to FIG. 27, for a pair of bit lines BL and ZBL, a bit line isolation gate 511 connecting bit lines BL and ZBL to a sense amplifier circuit (SA) 510 according to switch control signal MUX, a voltage selection circuit 513 selecting one of bit line equalize voltage VEQ and voltage from an output enable terminal (/G pin) according to test mode equalize instruction signals TMEQ and /TMEQ, and a bit line precharge circuit 512 transmitting the voltage from voltage selection circuit 513 to bit lines BL and ZBL according to an output signal of a bit line precharge control circuit 515 are provided.

A memory cell MC is arranged at the crossing of bit line BL and word line WL. Memory cell MC includes a capacitor Cm and an n channel MOS transistor Tm connecting capacitor Cm and bit line BL in response to the signal potential on word line WL.

Bit line precharge control circuit 515 receives test mode equalize instruction signal TM_SAEQ and bit line equalize instruction signal EQL and activates bit line precharge circuit 512 when one of those received signals is activated.

Bit line precharge circuit 512 includes MOS transistors Tc and Te which are turned on, when an output signal of bit line precharge control circuit 515 is activated, to transmit voltage from voltage selection circuit 513 to bit lines BL and ZBL respectively, and an n channel MOS transistor Td short-circuiting bit lines BL and ZBL.

Voltage selection circuit 513 includes a transfer gate Tg which becomes conductive, when test mode equalize instruction signal TMEQ is activated, to transmit voltage externally applied via the output enable terminal (/G pin), and a transfer gate Tf which becomes conductive, when test mode equalize instruction signal /TMEQ is inactivated, to transmit intermediate voltage VEQ from a bit line precharge voltage generating circuit (not shown).

For sense amplifier circuit (SA) 510, a p channel MOS transistor Tb and an n channel MOS transistor Ta which are turned on, in response to an output signal from sense amplifier control circuit 514, to transmit the power supply voltage and the ground voltage to sense amplifier circuit (SA) 510 are provided.

Sense amplifier control circuit 514 includes an NOR circuit 514a receiving inverted signal /SET of sense amplifier activation signal SET and test mode equalize instruction signal TM—SAEQ, and an inverter circuit 514b inverting an output signal of NOR circuit 514a. The output signal of NOR circuit 514a is supplied to a gate of n channel MOS transistor Ta, and the output signal of inverter circuit 514b is supplied to a gate of MOS transistor Tb.

An operation of the bit line peripheral circuitry shown in FIG. 27 is described below in conjunction with the signal waveform diagram shown in FIG. 28.

In a normal read/write mode in which a normal data access is made, word line WL is selected according to externally supplied row address strobe signal /RAS and an access (read or write) is made to a selected memory cell. At this time, test mode equalize instruction signals TM—SAEQ and TMEQ are in the inactive state of L level. Accordingly, voltage selection circuit 513 selects precharge voltage VEQ from the internal bit line precharge voltage generating circuit, and control circuits 514 and 515 control activation of sense amplifier 510 and activation of bit line precharge circuit 512, respectively, according to sense amplifier activation signal /SET and bit line equalize instruction signal EQL.

When a test mode starts, test mode instruction signal TM is activated, test mode equalize instruction signal TMEQ attains H level, and test mode equalize instruction signal TM—SAEQ is set at H level. Voltage selection circuit 513 selects external voltage applied externally via the output enable terminal (/G pin). Bit line precharge circuit 512 is activated in response to activation of an output signal of bit line precharge control circuit 515 and transmits the external voltage from voltage selection circuit 513 onto bit lines BL and ZBL. Sense amplifier circuit 510 is maintained in the inactive state according to an output signal of sense amplifier control circuit 514. The externally applied voltage is forced to stay at L level and multi-selection of word lines is carried out by utilizing the structure shown in FIG. 25. Thus, stress equal to the voltage on word line WL is applied to the gate insulating film of memory cell transistor Tm. Acceleration of the voltage stress on the gate insulating film of the memory cell transistor is accomplished.

In the structure shown in FIG. 25, all word lines WL are selected. In the structure in FIG. 27, test mode equalize instruction signals TM—SAEQ and TMEQ are set at H level and the voltage supplied from the output enable terminal (/G pin) is set at the ground voltage level. Accordingly, the voltage stress applied to the gate insulating films of all memory cell transistors can be accelerated simultaneously so that the time needed to effect the voltage stress acceleration of the gate insulating films can be decreased.

This burn-in test includes a test mode in which the voltage stress between adjacent memory cell capacitors is accelerated to reveal a potential defect of an interlayer insulating film between the adjacent memory cell capacitors.

FIG. 29A is a schematic view illustrating an arrangement of memory cells MC. FIG. 29A illustrates memory cells arranged at crossings of bit line pairs BL0, ZBL0 and BL1, ZBL1 and word lines WL0–WL8.

Memory cells MC are arranged periodically in a column direction with two memory cells MC being one unit. In a row direction (direction in which word lines extend), memory cell capacitors Cm are aligned with each other and bit line contacts BCT are aligned with each other in the row direction. In the column direction, between memory units each including two memory cells, there is an empty region corresponding to a word line pitch.

A sense amplifier circuit SA0 is associated with bit lines BL0 and ZBL0, and a sense amplifier circuit SA1 is associated with the pair of bit lines BL1 and ZBL1. Two memory cells MC are connected to a bit line via one bit line contact BCT, so that the number of contact regions decreases and accordingly the memory cells can be arranged highly densely.

FIG. 29B is a schematic cross sectional view showing a structure of the memory cell in FIG. 29A in the row direction. Referring to FIG. 29B, memory cell MC includes high concentration impurity regions 521b and 521c formed at the surface of a P type semiconductor substrate region 520, a storage node electrode 522b connected to impurity region 521b, a conductive layer 525 forming a bit line and connected to impurity region 521c, and a conductive layer 524 forming a word line and placed between impurity regions 521b and 521c with a gate insulating film (not shown) underlaid.

An adjacent memory cell includes a high concentration impurity region 521a isolated from impurity region 521b by a field insulating film 526, and a storage node electrode layer 522a connected to high concentration impurity region 521a. No transistor of the adjacent memory cell is shown.

A cell plate electrode layer 523 is formed commonly above storage node electrode layers 522a and 522b with a capacitor insulating film (not shown) interposed thereunder.

Suppose that the distance between storage node electrode layers 522a and 522b of the memory cell capacitors in the row direction is short as shown in FIG. 29B, and voltage stress is accelerated in order to reveal any potential defect of the interlayer insulating film between the storage node electrodes. In this case, it is required that data of L level, H level, L level and H level are written respectively into memory cell capacitors Cma, Cmb, Cmc and Cmd aligned in the row direction and the voltage level of the H level is raised. Specifically, bit lines BL0 and BL1 are set at H level, complementary bit lines ZBL0 and ZBL1 are set at L level, and all word lines are selected. In order to implement this operation, according to a normal operation mode, data of L level, H level, L level and H level are preliminary written into respective memory cell capacitors Cma, Cmb, Cmc and Cmd with the structure shown in FIGS. 25 and 27. When a test mode starts, it is then required that one word line is selected, a sense amplifier is activated, bit lines ZBL0 and ZBL1 are set at L level, bit lines BL0 and BL1 are set at H level, and thereafter word lines are successively driven into the selected state.

However, in order to write data into memory cell capacitors Cma–Cmd, an address should be designated externally to select the memory cell and write data into the selected memory cell. In order to select word lines successively, addresses should externally be designated successively in the structure shown in FIG. 25. Therefore, it is impossible to set all memory cells in the selected state at a high speed and a problem of increase of time period required for the burn-in (acceleration) test arises.

If the burn-in (acceleration) test is done after packaging, packaged memory devices are inserted into a plurality of sockets formed in a burn-in board and burn-in tests are performed simultaneously for a plurality of memory devices. In this case, if address signals are used to internally select word lines and memory cells successively, address signals should be applied to each board. A problem of shortage in number of pin terminals of a burn-in tester (aging device) then arises.

If the acceleration test is done at a wafer level, a tester contacts probes thereof with a plurality of dies (chips) on the wafer. In this case, address signals should be supplied in parallel to a plurality of dies (chips) and a problem of a considerable shortage in number of pins of the wafer burn-in tester arises.

The conventional structure shown in FIG. 25 in which all word lines are simultaneously driven into the selected state is accompanied by a problem that voltage stress on a contaminant particle between word lines cannot be accelerated.

SUMMARY OF THE INVENTION

An object of the present invention is to provide a semiconductor memory device capable of effecting a voltage stress acceleration test speedily and correctly with a small number of control signals.

Another object of the invention is to provide a semiconductor memory device capable of applying voltage stress between memory cell capacitors with a small number of control signals and in a short period of time.

Still another object of the invention is to provide a semiconductor memory device capable of accelerating voltage stress of short-circuit between word lines with a small number of control signals.

A further object of the invention is to provide a semiconductor memory device capable of driving a plurality of word lines simultaneously into selected state speedily with a small number of signals.

According to a first aspect of the present invention, a semiconductor memory device includes a plurality of memory cells arranged in rows and columns, a plurality of word lines arranged corresponding to the rows and each connected to memory cells of a corresponding row, a plurality of pairs of bit lines arranged corresponding to columns and each connected to memory cells of a corresponding column, a plurality of sense amplifier circuits arranged corresponding to the columns and activated to sense and amplify data in a memory cell on a corresponding column, a plurality of bit line precharge circuits arranged corresponding to the column and coupled to a reference voltage transmission line and each activated to transmit voltage on the reference voltage transmission line to a pair of bit lines of a corresponding column, and a test control circuit for activating each of the bit line precharge circuits and driving simultaneously into selected state a first predetermined number of word lines among a plurality of word lines in a first test mode operation, and inactivating a plurality of bit line precharge circuits, driving simultaneously into selected state a second predetermined number of word lines among a plurality of word lines and activating a plurality of sense amplifier circuits in a second test mode operation.

According to a second aspect of the present invention, a semiconductor memory device includes a plurality of memory blocks each having a plurality of memory cells arranged in rows and columns, a plurality of word lines arranged corresponding to the rows and each connected to memory cells of a corresponding row, and a plurality of pairs of bit lines arranged corresponding to the columns and each connected to memory cells of a corresponding column, a plurality of groups of sense amplifiers including a plurality of sense amplifier circuits shared by memory blocks adjacent to each other in the column direction and, each corresponding to a column of a corresponding memory block and activated to sense and amplify data in a memory cell of a corresponding column, a plurality of bit line isolation circuits arranged between each group of sense amplifiers and a corresponding memory block and each activated to isolate a corresponding group of sense amplifiers from the corresponding memory block, a plurality of bit line precharge circuits arranged corresponding to the pairs of bit lines and shared by memory blocks adjacent to each other and connected to a reference voltage transmission line and each activated to transmit voltage on the reference voltage transmission line to a pair of bit lines of a corresponding column, and a test control circuit.

The test control circuit activates each bit line precharge circuit, inactivates a plurality of bit line isolation circuits, and drives simultaneously into selected state a first predetermined number of word lines among a plurality of word lines in each memory block in a first test mode operation, and inactivates a plurality of bit line precharge circuits, drives simultaneously into selected state a second predetermined number of word lines among a plurality of word lines in each memory block, and activates a plurality of sense amplifier circuits in a second test mode operation.

A bit line precharge circuit is activated and a plurality of word lines are selected simultaneously, so that data can be written into a memory cell by the voltages from the bit line precharge circuits and accordingly a column selecting operation becomes unnecessary.

Further, the bit line precharge circuits are inactivated, a plurality of word lines are simultaneously selected and a plurality of sense amplifiers are activated. As a result, the bit line voltage level can be set according to the data stored in a memory cell and the sense amplifier supply voltage can be changed to accelerate voltage stress between adjacent memory cell capacitors.

Geometrically alternate word lines are selected so that latent short-circuit between word lines can be revealed by voltage stress acceleration.

Further, an external control signal is used to generate an internal operation control signal and an internal address signal so that the number of signals supplied externally in the acceleration test can be decreased and accordingly the number of pins (the number of probes) of a burn-in tester (aging tester) can be decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Whole Structure

Figure 1:
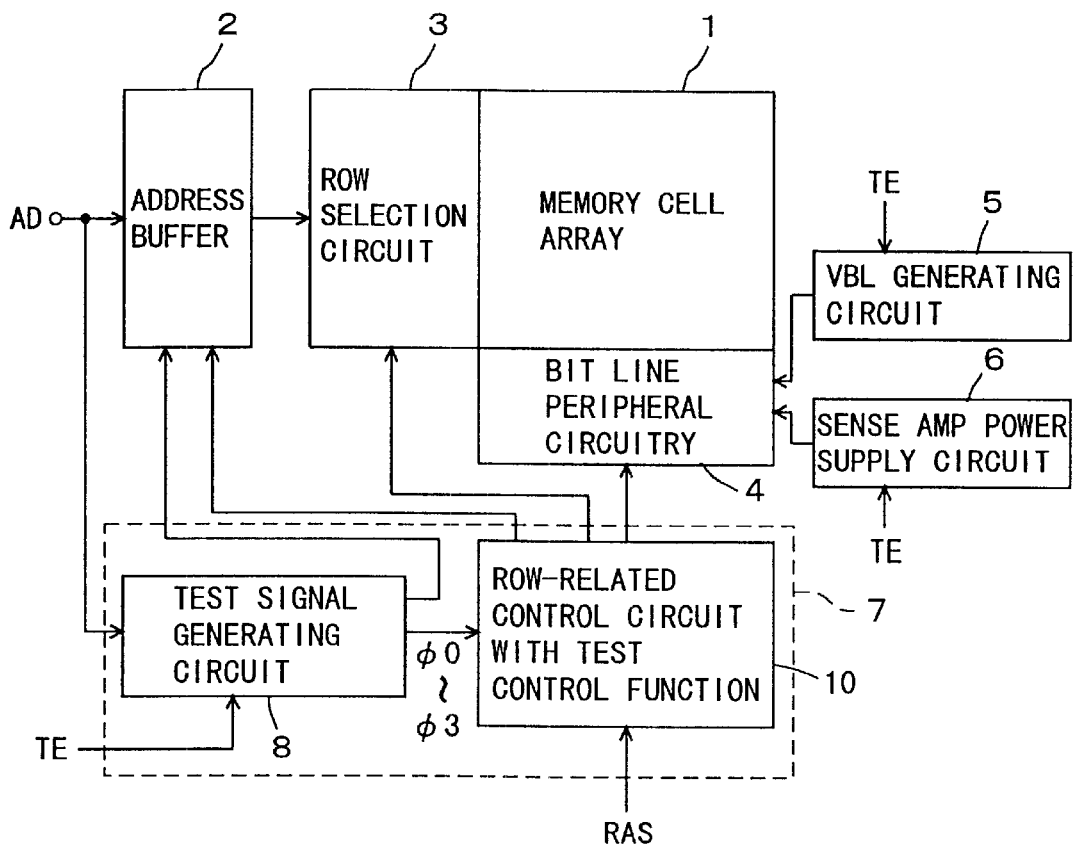
FIG. 1 is a schematic diagram showing an entire structure of a semiconductor memory device according to the present invention.

FIG. 1 is a schematic diagram showing the whole structure of a semiconductor memory device according to the present invention. Referring to FIG. 1, the semiconductor memory device includes a memory cell array 1 including a plurality of memory cells arranged in rows and columns, an address buffer 2 taking therein externally supplied address signal AD to generate an internal address signal, a row selection circuit 3 driving an addressed row in memory cell array 1 into selected state according to an internal row address signal from address buffer 2, and bit line peripheral circuitry 4 placed for bit lines arranged corresponding to columns of memory cell array 1.

In memory cell array 1, a word line is arranged corresponding to each row of memory cells, and a pair of bit lines is arranged corresponding to each column of memory cells. Bit line peripheral circuitry 4 includes a sense amplifier circuit and bit line precharge/equalize circuit provided for each pair of bit lines.

The semiconductor memory device further includes a VBL generating circuit 5 which supplies precharge voltage VBL to the bit line equalize/precharge circuits included in bit line peripheral circuitry 4, a sense amplifier power supply circuit 6 which applies a power supply voltage to the sense amplifier circuits included in bit line peripheral circuitry 4, and a test control circuit (row-related control circuit) 7 which controls an operation related to row selection according to test mode instruction signal TE and internal row address strobe signal (array activation signal) RAS.

VBL generating circuit 5 and sense amplifier power supply circuit 6 can generate voltages at externally controllable levels when test mode instruction signal TE is activated.

Test control circuit 7 includes a test signal generating circuit 8 taking therein address signal AD supplied to an address terminal to generate internal test control signals φ0–φ3 when test mode instruction signal TE is activated, and a row-related control circuit with test control function 10 generating a control signal of a row-related circuit in a test mode according to test control signals φ0–φ3 from test signal generating circuit 8 and generating a row-related control signal according to internal row address strobe signal RAS in a normal operation mode. Address buffer 2 receives a test instruction signal from test signal generating circuit 8, operates under control by row-related control circuit with test control function 10, and generates an internal address signal according to the test instruction signal. Row-related control circuit with test control function 10 controls operations of row selection circuit 3 and bit line peripheral circuitry 4.

In the test mode, a part of bits of address signal AD is used to generate test control signals φ0–φ3, and an internal row address signal and an internal row selection operation control signal are generated according to test control signals φ0–φ3. Therefore, signals corresponding to test control signals φ0–φ3 are required to be externally supplied, and use of all address bits is unnecessary, so that an acceleration test (burn-in test) can be, performed with a small number of signals. Structures of respective portions are hereinafter described.

Internal row address strobe signal RAS may simply be generated according to external row address strobe signal ext/RAS which is externally supplied via a buffer circuit. Alternatively, internal row address strobe signal RAS may be driven into the active state when an active command of instructing array activation is supplied. The command is supplied by a combination of states of a plurality of external signals.

Structure of Test Mode Instruction Signal Generating Unit

Figure 2:
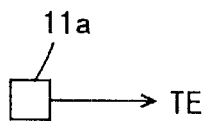
FIG. 2 is a schematic diagram showing a structure of a test mode instruction signal generating unit.

FIG. 2 shows a structure of a test mode instruction signal generating unit. Referring to FIG. 2, test mode instruction signal TE is externally supplied via a pad 11a. Pad 11a may be a pad connected to a pin terminal, or may be an unused pad. When an acceleration test is done at a wafer level, test mode instruction signal TE can be supplied to an appropriate pad from a tester. After packaging, pad 11a is connected to a pin terminal and the test mode instruction signal is supplied from an external tester via this pin terminal. The pin terminal employed for the test after the packaging may merely be a pin terminal which is not employed in the test mode, but is employed in a normal mode of operation. That is, the pin terminal may not be a dedicated pin terminal.

Figure 3:
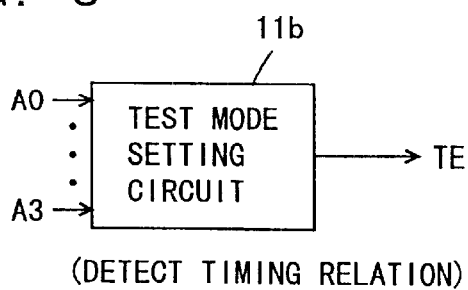
FIG. 3 is a schematic diagram showing another structure of the test mode instruction signal generating unit.

FIG. 3 shows another structure of the test mode instruction signal generating unit. Referring to FIG. 3, test mode instruction signal TE is generated by a test mode setting circuit 11b receiving specific address signal bits A0–A3 from an outside of the device. Test mode setting circuit 11b activates and inactivates test mode instruction signal TE according to the timing relation of address signal bits A0–A3. Address signal bits A0–A3 are also employed for setting a row address signal and determining row selection operation timing in the acceleration test, and timing relation which is not employed in the test operation is utilized to implement activation/inactivation of test mode instruction signal TE. For example, address signal bit A0 rises to H level after address signal bits A1–A3 attain H level, then test mode instruction signal TE is activated. Address signal bits A2 and A3 rise to H level after both of address signal bits A0 and A1 rise, then test mode instruction signal TE is inactivated. In the structure shown in FIG. 3, a control signal used in the test mode can be also used for setting of the test mode so that there is no increase in the number of signals, and increase in the number of pin terminals of a tester can be avoided.

Structure of Test Signal Generating Circuit

Figure 4:
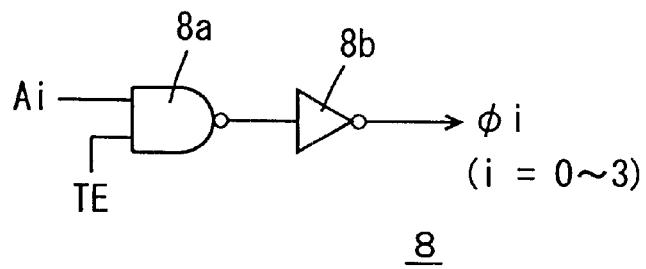
FIG. 4 shows a structure of a test signal generating circuit shown in FIG. 1.

FIG. 4 shows a structure of test signal generating circuit 8 shown in FIG. 1. Referring to FIG. 4, test signal generating circuit 8 includes an NAND circuit 8a receiving externally supplied address signal bit Ai (i=0–3) and test mode instruction signal TE, and an inverter circuit 8b inverting an output signal of NAND circuit 8a to generate test control signal $\phi i$.

When test mode instruction signal TE is in the inactive state of L level, test control signal $\phi i$ is fixed at L level. When test mode activation signal TE attains the active state of H level, the logic state of test control signal $\phi i$ is determined according to externally supplied address signal bit Ai. 4-bit address signal A0–A3 is used to control all operations in the acceleration test and thus the number of control signals used in the acceleration test is decreased.

Schematic Structure of Row-Related Control Circuit with Test Control Function

Figure 5:
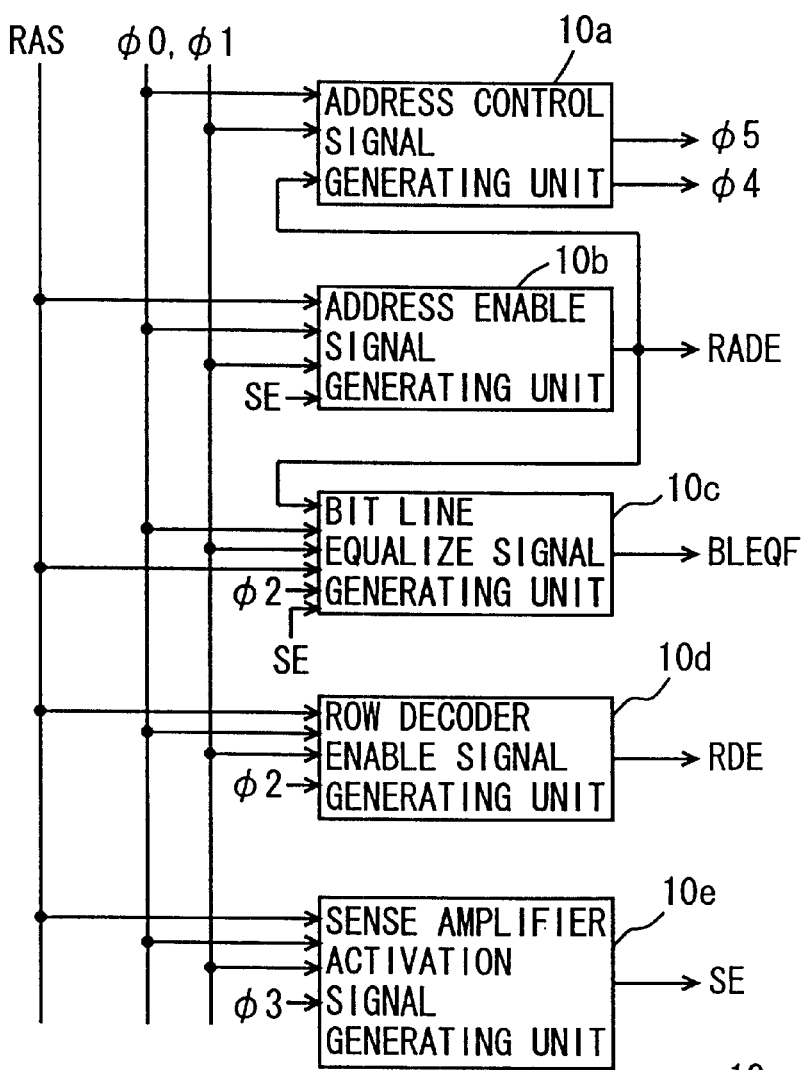
FIG. 5 is a schematic diagram showing a structure of a row-related control circuit having a test control function shown in FIG. 1.

FIG. 5 is a schematic diagram showing a structure of row-related control circuit with test control function 10 shown in FIG. 1. Referring to FIG. 5, row-related control circuit with test control function 10 includes an address control signal generating unit 10a generating address control signals $\phi 4$ and $\phi 5$ according to test control signals $\phi 0$ and $\phi 1$ and row address enable signal RADE, an address enable signal generating unit 10b receiving internal row address strobe signal RAS, test control signals $\phi 0$ and $\phi 1$ and sense amplifier activation signal SE to generate row address enable signal RADE, a bit line equalize signal generating unit 10c receiving row address enable signal RADE, internal row address strobe signal RAS, test control signals $\phi 0$–$\phi 2$ and sense amplifier activation signal SE to generate bit line equalize control signal BLEQF, a row decoder enable signal generating unit 10d receiving internal row address strobe signal RAS and test control signals $\phi 0$–$\phi 2$ to generate row decoder enable signal RDE, and a sense amplifier activation signal generating unit 10e receiving internal row address strobe signal RAS and test control signals $\phi 0$, $\phi 1$ and $\phi 3$ to generate sense amplifier activation signal SE.

In a normal operation mode, row address enable signal RADE, bit line equalize control signal BLEQF, row decoder enable signal RDE and sense amplifier activation signal SE are activated in a predetermined sequence according to internal row address strobe signal RAS. (Bit line equalize control signal BLEQF is inactivated.)

In an acceleration test, whether or not internal control signals RADE, BLEQF, RDE and SE are activated or inactivated is determined according to a combination of logic states of test control signals $\phi 0$ and $\phi 1$. Specifically, in the acceleration test, a row selecting operation is performed according to test control signals $\phi 0$–$\phi 3$ and bit line voltage is controlled under external control. According to address control signals $\phi 4$ and $\phi 5$ and test control signals $\phi 0$ and $\phi 1$, a logic state of an internal row address bit is determined in the acceleration test. In this way, externally supplied 4-bit test control signals are used to perform a row selecting operation and a row designation in the acceleration test, and a required number of word lines are driven simultaneously into selected state.

Figure 6:
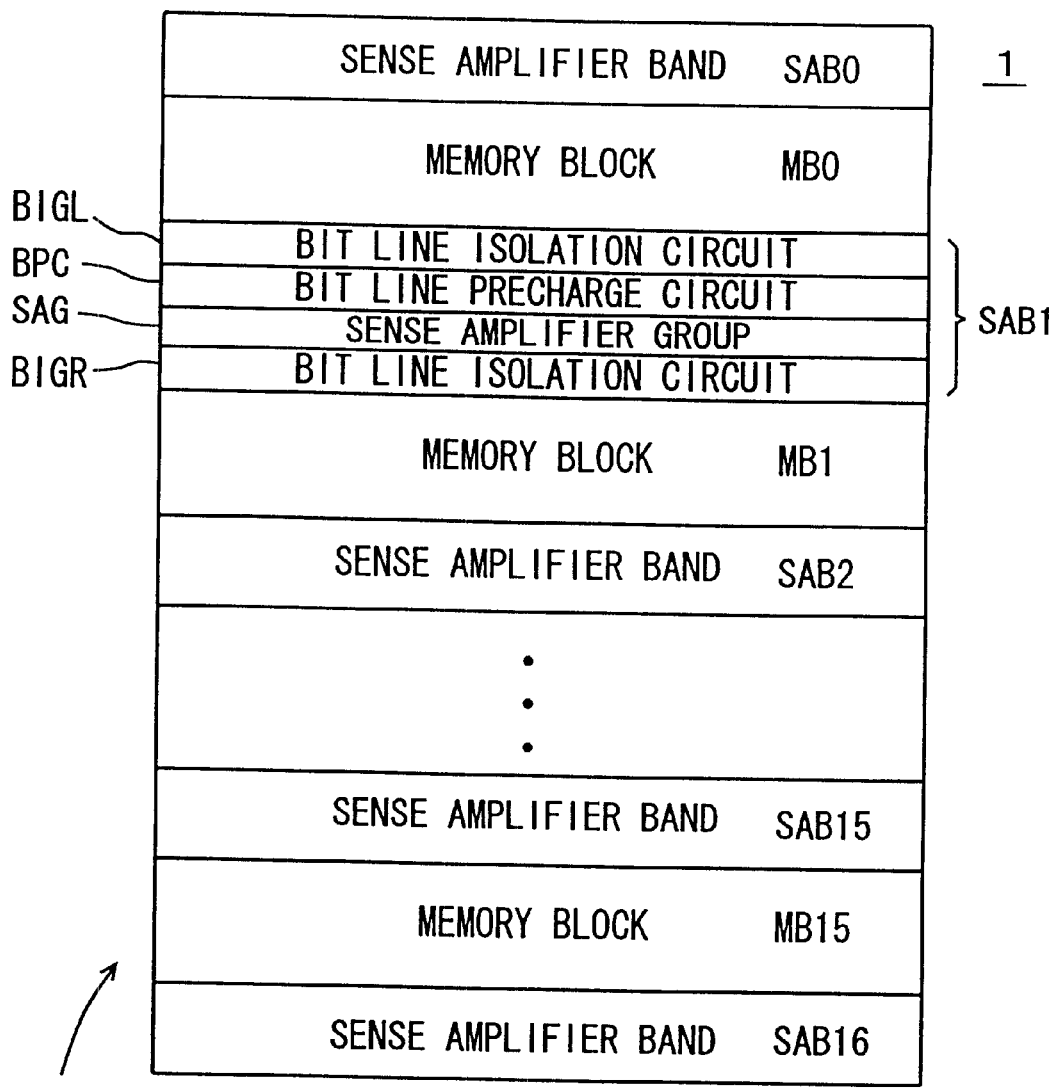
FIG. 6 is a schematic diagram showing a structure of a memory cell array shown in FIG. 1.

FIG. 6 is a schematic view illustrating a structure of memory cell array 1 shown in FIG. 1. Referring to FIG. 6, memory cell array 1 is divided into a plurality of memory blocks MB0–MB15. Between memory blocks MB0–MB15, sense amplifier bands SAB1–SAB15 are arranged such that a sense amplifier band is shared by memory blocks adjacent to each other in the column direction, and sense amplifier bands SAB0 and SAB16 are arranged outside memory blocks MB0 and MB15, respectively.

Each of sense amplifier bands SAB0–SAB16 includes sense amplifiers groups SAG including sense amplifier circuits provided corresponding to columns of a corresponding memory block, bit line isolation circuits BIGL and BIGR each for isolating a corresponding memory block from the amplifier groups, and a bit line precharge circuit BPC for precharging bit lines of columns of the corresponding memory blocks.

One of the sixteen memory blocks MB0–MB15 is designated by 8-bit predecode signals X20–X27 generated based on row address signal bits RAD9–RAD12. According to remaining address signal bits RAD0–RAD8, a word line in a memory block is designated. These address signal bits RAD0–RAD12 are generated according to test control signals $\phi 0$ and $\phi 1$, and address control signals $\phi 4$ and $\phi 5$ to drive a desired number of memory blocks and a desired number of word lines into selected state. An operation in the acceleration test according to the present invention is hereinafter described briefly.

Figure 7:
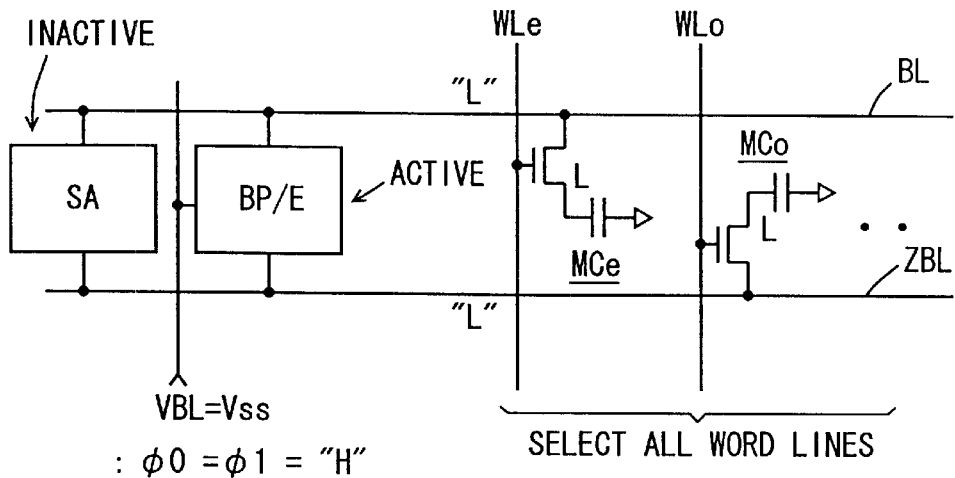
FIG. 7 is a schematic diagram showing a state of operation 1 in an embodiment of the present invention.

As shown in FIG. 7, test control signals $\phi 0$ and $\phi 1$ are first set at H level and sense amplifier activation signal SE from sense amplifier activation signal generating unit 10e is maintained in the inactive state, while bit line equalize control signal BLEQF from bit line equalize signal generating unit 10c is set in the active state of H level. With this state maintained, the voltage level of precharge voltage VBL applied to a bit line precharge/equalize circuit BP/E included in bit line precharge circuit BPC is set at ground voltage Vss level. According to control signals $\phi 0$ and $\phi 1$, all row address signals are set into selected state and all word lines WLe and WLo are driven into selected state. Accordingly, voltage at L level is applied onto bit lines BL and ZBL via bit line precharge/equalize circuit BP/E so that the voltage at L level is written into memory cells MCe and MCo.

Figure 8:
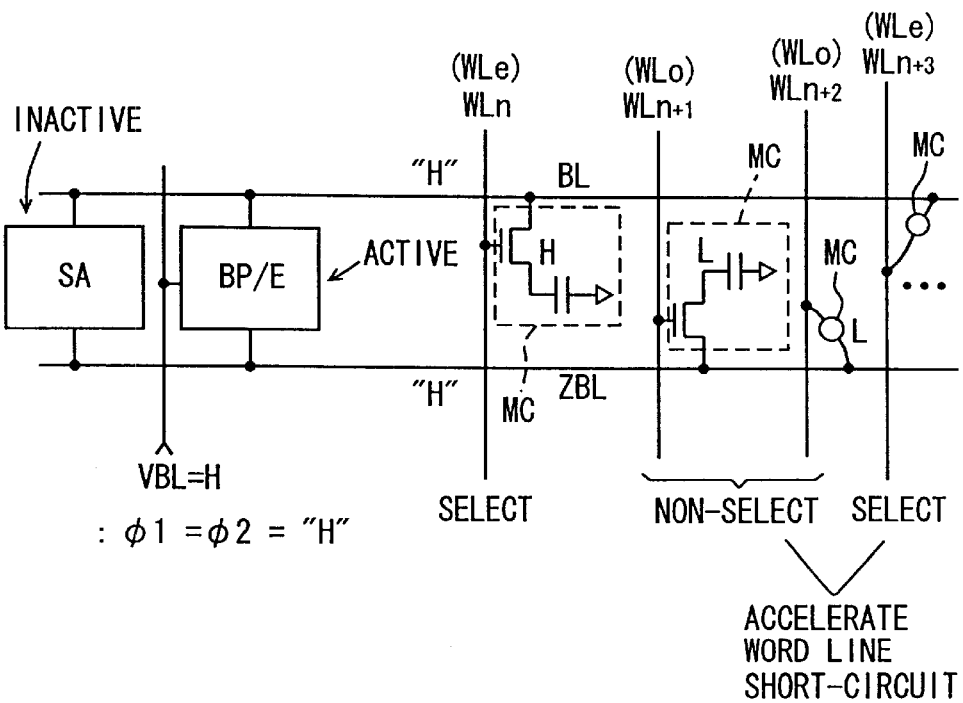
FIG. 8 is a schematic diagram showing a state of operation 2 in the embodiment of the present invention.
Figure 29A:
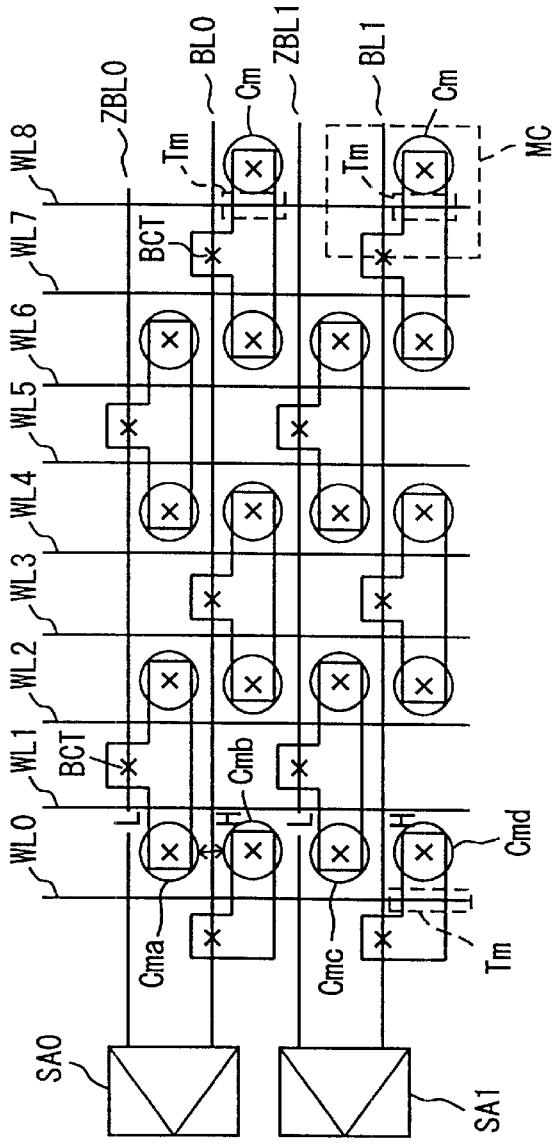
FIG. 29A is a schematic view illustrating layout of memory cells of the conventional semiconductor memory device.
Figure 29B:
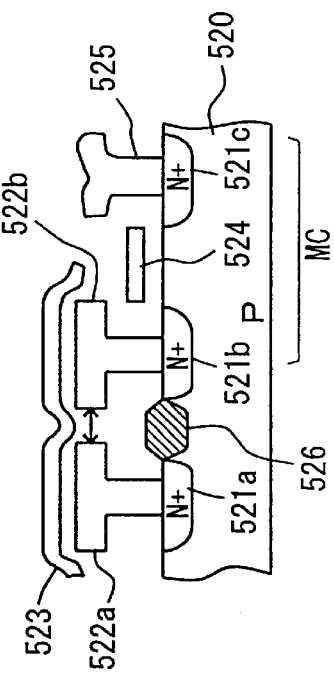
FIG. 29B is a schematic view illustrating a cross sectional structure of a memory cell.

Referring to FIG. 8, test control signals $\phi 1$ and $\phi 2$ are next set at H level. In this state, sense amplifier circuit SA is in the inactive state while bit line precharge/equalize circuit BP/E is maintained in the active state. By setting test control signals $\phi 1$ and $\phi 2$ at H level, word lines WLn and WLn+3 are driven into selected state according to row address signals generated based on these test control signals. Memory cells MC connected to bit line BL are connected to these word lines WLn and WLn+3. Memory cells connected to complementary bit line ZBL are connected to word lines WLn+1 and WLn+2. With 2 bits being one unit, memory cells are connected alternately to a bit line and a complementary bit line in the column direction (see FIG. 29A).

In this state, bit line precharge voltage VBL is set at the power supply voltage level of H level. In this way, data of H level is written into memory cells connected to word lines WLn and WLn+3.

When operations represented in FIGS. 7 and 8 are completed, data of H level is written into memory cells MC connected to bit line BL and data of L level is written into memory cells MC connected to complementary bit line ZBL. Further, in this state, word line WLn+1 is at L level and word line WLn+3 is at H level. If word lines WLn+3 and WLn+1 are potentially short-circuited due to any particle, accelerated voltage stress can be applied to the particle and accordingly the short-circuit of these word lines can be accelerated by heat generation and carbonization of the particle due to the accelerated voltage stress. This holds for other word lines.

When the short-circuit between word lines is accelerated, the voltage level (boosted voltage Vpp) of the word line drive signal supplied to the word line is further raised.

By the operations shown in FIGS. 7 and 8, data of H level and L level can be written into memory cells without external address designation (first test mode).

Figure 9:
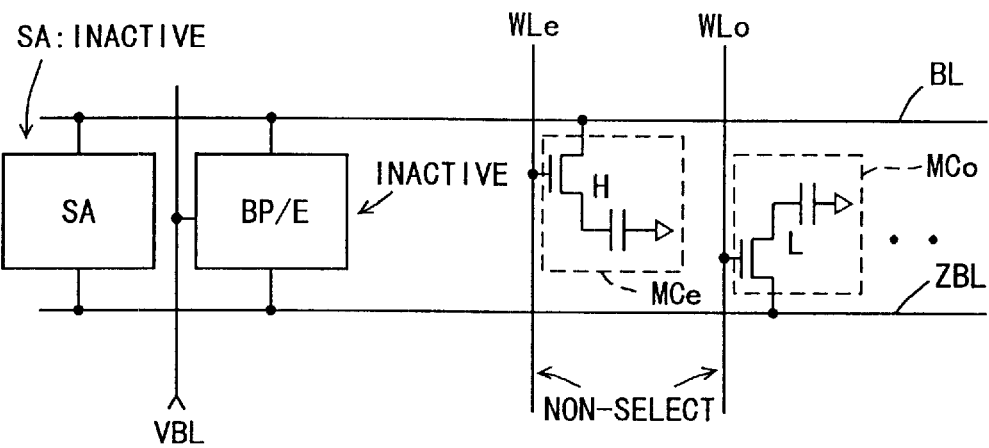
FIG. 9 is a schematic diagram showing a state of operation 3 in the embodiment of the present invention.

Referring to FIG. 9, test control signals φ0 and φ2 are set at H level, word lines are all set in non-selected state and bit line precharge/equalize circuit BP/E is set in the inactive state. Bit lines BL and ZBL are set into an electrically floating state to make preparation for reading of data written in memory cells MC (MCe, MCo).

Figure 10:
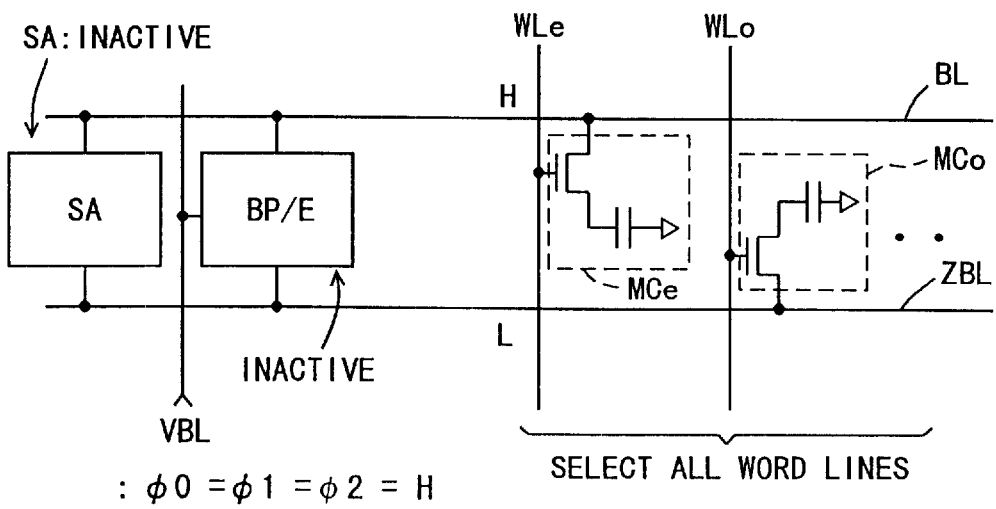
FIG. 10 is a schematic diagram showing a state of operation 4 in the embodiment of the present invention.

Referring to FIG. 10, test control signals φ0, φ1 and φ2 are all set at H level, with bit line precharge/equalize circuit BP/E and sense amplifier circuit SA maintained in the inactive state, all word lines are driven into selected state (All row address bits are set in selected state and the row decoder is activated.) Accordingly, read voltage at H level and L level are transmitted respectively to bit lines BL and ZBL.

In other words, all address bits are set in selected state according to address control signals φ4 and φ5 from address control signal generating unit 10a shown in FIG. 5, and address enable signal generating unit 10b and row decoder enable signal generating unit 10d are activated. On the other hand, bit line equalize signal generating unit 10c and sense amplifier activation signal generating unit 10e are maintained in the inactive state. In this way, word line selection discussed above is implemented.

Figure 11:
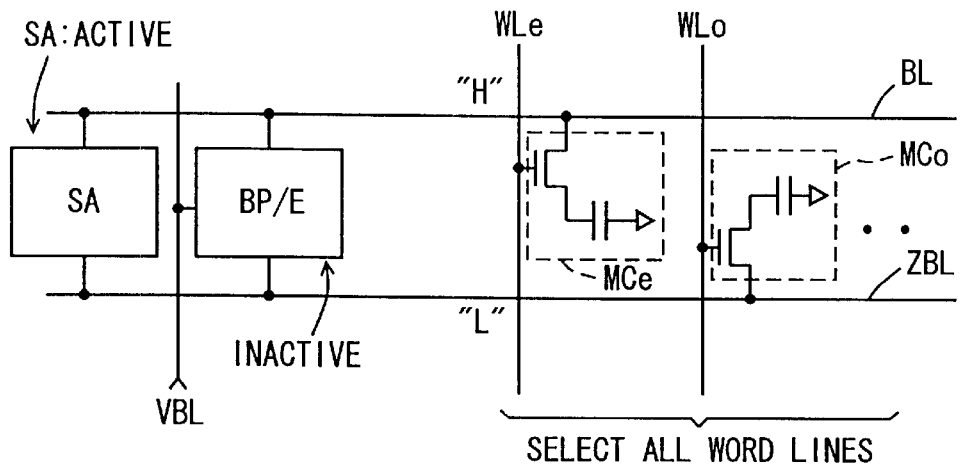
FIG. 11 is a schematic diagram showing a state of operation 5 in the embodiment of the present invention.

Referring to FIG. 11, all test control signals φ0–φ3 are set at H level to activate sense amplifier circuit SA. This is accomplished by activation of sense amplifier activation signal generating unit 10e shown in FIG. 5 to activate sense amplifier activation signal SE. Read voltages at H level and L level read onto bit lines BL and ZBL are respectively driven into array power supply voltage Vccs and ground voltage Vss levels and latched by sense amplifier circuit SA.

Figure 12:
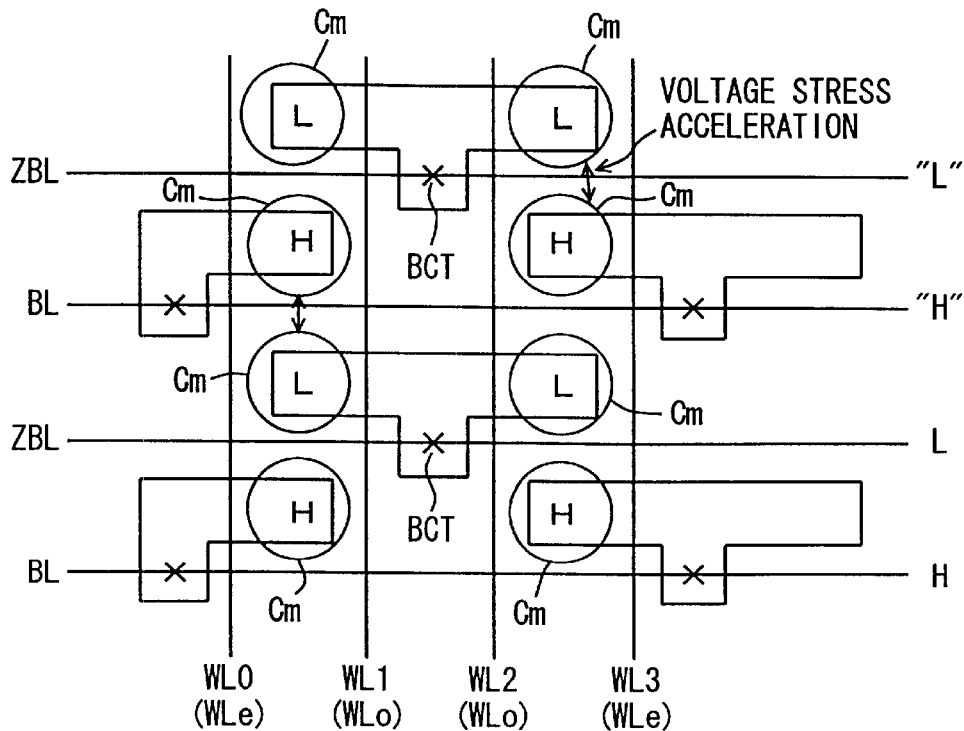
FIG. 12 illustrates data stored in a memory cell capacitor in the state of operation 5 in the embodiment of the present invention.

In this state, as shown in FIG. 12, L level data and H level data are alternately written into capacitors Cm of memory cells aligned in the row direction (restored by the sense amplifier circuit). Then, the power supply voltage level of sense amplifier circuit SA is raised and the voltage level on the word line is also raised so that the voltage level of data of H level written into memory cell capacitor Cm can be raised and the voltage stress between memory cell capacitors adjacent to each other in the row direction can be accelerated.

Just the four test control signals are utilized as the control signals as described above. There is no need to employ 13-bit row address signal even for 256M bit DRAM and thus the number of pin terminals or the number of probe terminals of the tester can be decreased. Detailed structures of respective portions are hereinafter described.

Detailed Structure of Row-Related Control Circuit with Test Control Function

Figure 13:
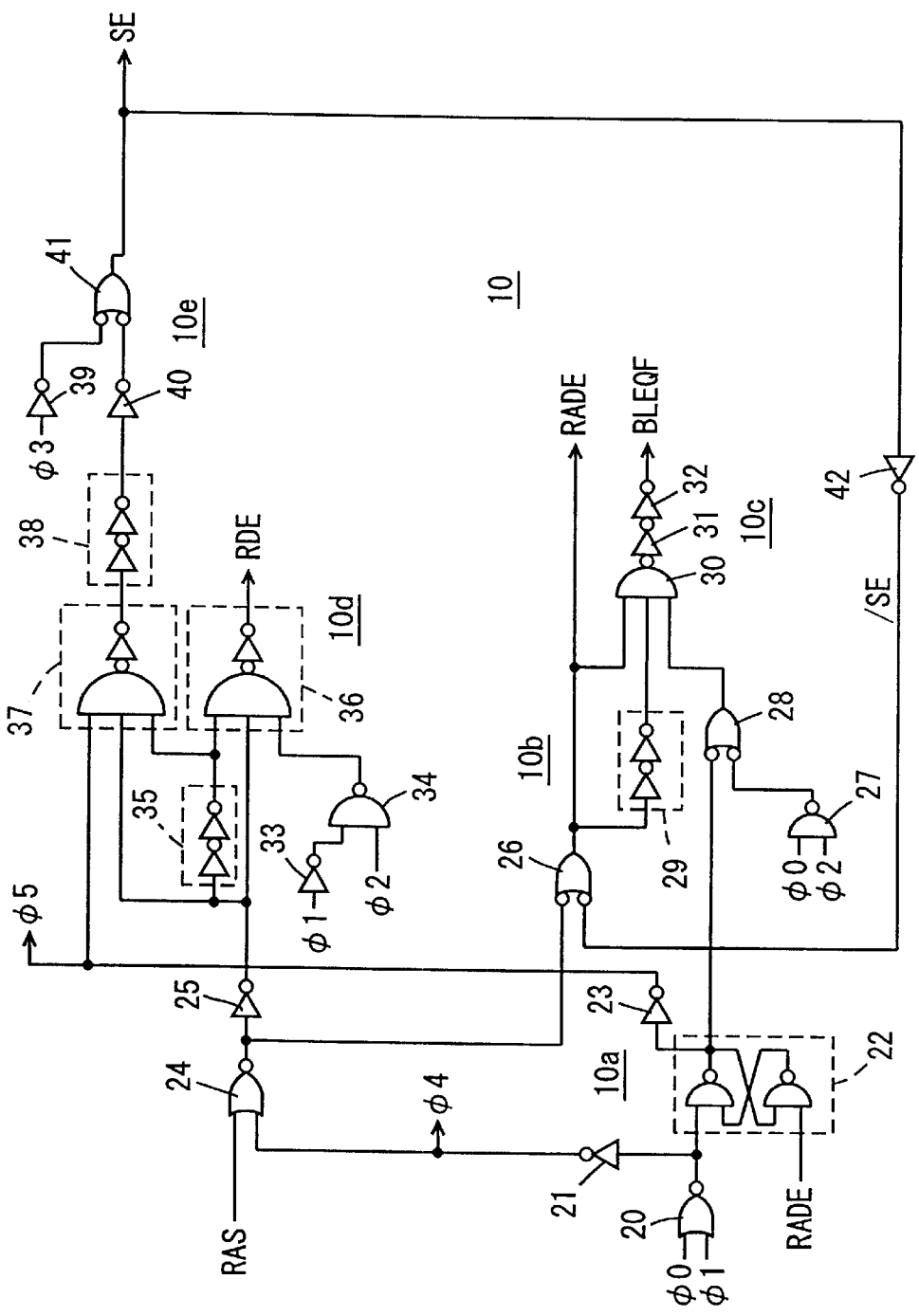
FIG. 13 specifically shows a structure of the row-related control circuit with test control function shown in FIG. 1.

FIG. 13 illustrates in detail the structure of row-related control circuit with test control function 10 shown in FIG. 1. Referring to FIG. 13, row-related control circuit with test control function 10 includes an NOR circuit 20 receiving test control signals φ0 and φ1, an inverter circuit 21 inverting an output signal of NOR circuit 20 to generate address control signal φ4, a flip-flop circuit 22 set when an output signal of NOR circuit 20 is at L level and reset when row address enable signal RADE is at L level, and an inverter circuit 23 inverting an output signal of flip-flop circuit 22 to generate address control signal φ5. The portion generating address control signals φ4 and φ5 corresponds to address control signal generating unit 10a shown in FIG. 5.

Row-related control circuit with test control function 10 further includes an NOR circuit 24 receiving internal row address strobe signal RAS and address control signal φ4, and an inverter circuit 25 inverting an output signal of NOR circuit 24. NOR circuit 24 and inverter circuit 25 correspond to a circuit portion which invalidates internal row address strobe signal RAS in the acceleration test, and correspond to a circuit which is commonly provided to signal generating units 10a–10e shown in FIG. 5.

Row-related control circuit with test control function 10 further includes an NAND circuit 26 receiving an output signal of NOR circuit 24 and sense amplifier activation signal SE supplied via an inverter circuit 42 to generate row address enable signal RADE, a delay circuit 29 constituted of inverter circuits of two stages and delaying an output signal of NAND circuit 26, an NAND circuit 27 receiving test control signals φ0 and φ2, an NAND circuit 28 receiving an output signal of flip-flop circuit 22 and an output signal of NAND circuit 27, an NAND circuit 30 receiving row address enable signal RADE, an output signal of delay circuit 29 and an output signal of NAND circuit 28, an inverter circuit 31 receiving an output signal of NAND circuit 30, and an inverter circuit 32 inverting an output signal of inverter circuit 31 to generate bit line equalize control signal BLEQF.

NAND circuit 26 corresponds to address enable signal generating unit 10b shown in FIG. 5, and the path including NAND circuits 27, 28 and 30 corresponds to bit line equalize signal generating unit 10c shown in FIG. 5.

Row-related control signal with test control function 10 further includes an inverter circuit 33 receiving test control signal φ1, an NAND circuit 34 receiving an output signal of inverter circuit 33 and test control signal φ2, a delay circuit 35 constituted of inverter circuits of two stages and delaying an output signal of inverter circuit 25, an AND circuit 36 receiving an output signal of inverter circuit 25, an output signal of delay circuit 35 and an output signal of NAND circuit 34 to generate row decoder enable signal RDE, an AND circuit 37 receiving address control signal φ5, an output signal of inverter circuit 25 and an output signal of delay circuit 35, a delay circuit 38 including inverter circuits of two stages and delaying an output signal of AND circuit 37, an inverter circuit 40 inverting an output signal of delay circuit 38, an inverter circuit 39 inverting test control signal φ3, and an NAND circuit 41 receiving output signals of inverter circuits 39 and 41 to generate sense amplifier activation signal SE.

The path including NAND circuit 34 and AND circuit 36 corresponds to row decoder enable signal generating unit 10d shown in FIG. 5, and the path including AND circuit 37 and NAND circuit 41 corresponds to sense amplifier activation signal generating unit 10e shown in FIG. 5. An operation of row-related control circuit with test control function 10 shown in FIG. 13 is described in conjunction with the signal waveform diagram shown in FIG. 14.

In the acceleration test, internal row address strobe signal RAS is not used for the row selecting operation. Where internal row address strobe signal RAS is generated according to external row address strobe signal ext/RAS supplied to an external pin terminal (pad), an external row address strobe signal input terminal is in the electrically floating state in the acceleration test. Where internal row address strobe signal RAS is generated according to an active command (or row access command), an external control signal input terminal (pad) is also electrically in the floating state. In the acceleration test, internal row address strobe signal RAS is fixed at L level according to test mode instruction signal TE.

At time t0, test control signals φ0 and φ1 are set at H level. An output of NOR circuit 20 reaches L level, flip-flop circuit 22 is set and address control signal φ5 from inverter circuit 23 is set at L level. On the other hand, address control signal φ4 from inverter circuit 21 rises from a L level to H level and an output signal of NOR circuit 24 is set at L level regardless of the logic state of internal row address strobe signal RAS.

When the output signal of NOR circuit 24 falls to L level, row address enable signal RADE from NAND circuit 26 is accordingly driven into the active state of H level and a row address signal bits are latched by an address buffer as described later.

Since test control signal φ1 is set at H level, an output signal of inverter circuit 33 is set at L level and an output signal of NAND circuit 34 is accordingly set at H level. After the output signal of NOR circuit 24 falls to L level and a delay time of delay circuit 35 passes, row decode enable signal RDE output from AND circuit 36 is driven into the active state of H level and a decoding operation for a row address signal is carried out. Address control signal φ5 is at L level and accordingly an output signal of AND circuit 37 is set at L level. Because of L level of test control signal φ3, sense amplifier activation signal SE is maintained at L level. Because of L level of sense amplifier activation signal SE, row address enable signal RADE is changed according to address control signal φ4 by NAND circuit 26. On the other hand, an output signal of NAND circuit 28 is at L level, bit line equalize instruction signal BLEQF is maintained at H level, and bit line precharge/equalize circuit BP/E is maintained in the active state.

During the period starting at time t0 in which test control signals φ0 and φ1 are in the active state of H level, L level data are written into all memory cells as shown in FIG. 7. When test control signals φ0 and φ1 fall to L level, address control signal φ4 is set at L level and accordingly an output signal of NOR circuit 24 attains H level. Since sense amplifier activation signal SE is at L level, row address enable signal RADE rises to H level. Since test control signal φ2 is at L level, an output signal of NAND circuit 27 is set at H level. Since flip-flop circuit 22 is in the set state, an output signal of NAND circuit 28 is at L level and bit line equalize instruction signal BLEQF is maintained at H level. When row address enable signal RADE is driven to L level, the flip-flop 22 is reset, but NAND circuit 30 responsively outputs an H level signal to maintain bit line equalize instruction signal BLEQF at H level.

At time t1, test control signals φ1 and φ2 are set at H level. In response to H level of test control signal φ1, address control signal φ4 rises again to H level. After the delay time of delay circuit 35 passes, row decoder enable signal RDE is driven into the active state of H level. Row address enable signal RADE is driven again into the H level since the sense amplifier activation signal is in the inactive state of L level. Address control signal φ5 is maintained at L level and sense amplifier activation signal SE is maintained at L level during this operation. Because of L level of test control signal φ0, an output signal of NAND circuit 27 is at H level. Because of H level of an output signal of flip-flop circuit 22, an output signal of NAND circuit 28 is at L level and bit line equalize instruction signal BLEQF is maintained at H level.

In the period starting at time t1, the operation shown in FIG. 8 is carried out and H level data is written into memory cells connected to bit line BL via the bit line precharge/equalize circuit.

When this operation is completed and test control signals φ1 and φ2 fall to L level, address control signal φ4 accordingly falls to L level and one memory cycle is completed. Further, an output signal of inverter circuit 25 reaches L level and row decoder enable signal RDE reaches L level.

At time t2, test control signals φ0 and φ2 are set at H level. According to H level of test control signal φ0, address control signal φ4 attains H level and an output signal of inverter circuit 25 attains H level. Since test control signal φ1 is at L level and test control signal φ2 is at H level, an output signal of NAND circuit 34 is at L level and row decoder enable signal RDE is maintained at L level. On the other hand, since test control signals φ0 and φ2 are both at H level, an output signal of NAND circuit 27 reaches L level and an output signal of NAND circuit 28 reaches H level. Because of H level of row address enable signal RADE, an output signal of NAND circuit 30 reaches L level after the delay time of delay circuit 29 passes, and accordingly bit line equalize instruction signal BLEQF reaches L level. In this state, bit line precharge/equalize circuit BP/E is in the inactive state and bit lines BL and ZBL are in the electrically floating state as shown in FIG. 9.

At time t3, control signal φ1 is raised to H level so that an output signal of NAND circuit 34 attains H level. The time period between time t3 and time t2 is longer than the delay time of delay circuit 35. Therefore, when the output signal of NAND circuit 34 attains H level, row decoder enable signal RDE from AND circuit 36 is responsively driven to H level to effect a row selecting operation. The states of other internal control signals do not change.

At time t4, test control signal φ3 is driven to H level, and an output signal of inverter circuit 39 reaches L level, and sense amplifier activation signal SE from NAND circuit 41 is accordingly driven to H level. Responsively, a sense operation is carried out. In the period starting at time t4, voltage stress acceleration between memory cell capacitors is implemented.

At time t5, test control signals φ0–φ3 are all set at L level. Responsively, sense amplifier activation signal SE reaches L level, and row decoder enable signal RDE falls to L level. On the other hand, when sense amplifier activation signal SE reaches the inactive state, an output signal of NOR circuit 24 attains H level. Row address enable signal RADE is set at L level by NAND circuit 26, flip-flop 22 is reset, and address control signal φ5 rises to H level.

In the normal operation mode, test control signals φ0–φ3 are all set at L level (see FIG. 3). Therefore, according to internal row address strobe signal RAS, row address enable signal RADE attains H level, an externally supplied address signal is latched and subsequently row decoder enable signal RDE is activated. After row address enable signal RADE rises to H level and then a predetermined time passes, bit line equalize instruction signal BLEQF falls to L level. By delay circuit 29, bit line equalize instruction signal BLEQF is driven into the non-selected state and a bit line isolation circuit for a memory block sharing a sense amplifier group with a selected memory block is set into non-conductive state in parallel to a decoding operation for memory block selection.

In this way, a control signal corresponding to internal row address strobe signal RAS is generated according to address control signal φ4 and an operation of each circuit is controlled according to test control signals φ0–φ3 as shown in FIG. 13. By test control signals φ0–φ3, an operation of a row-related circuit can be set in a desired state by an external control signal.

Figure 15:
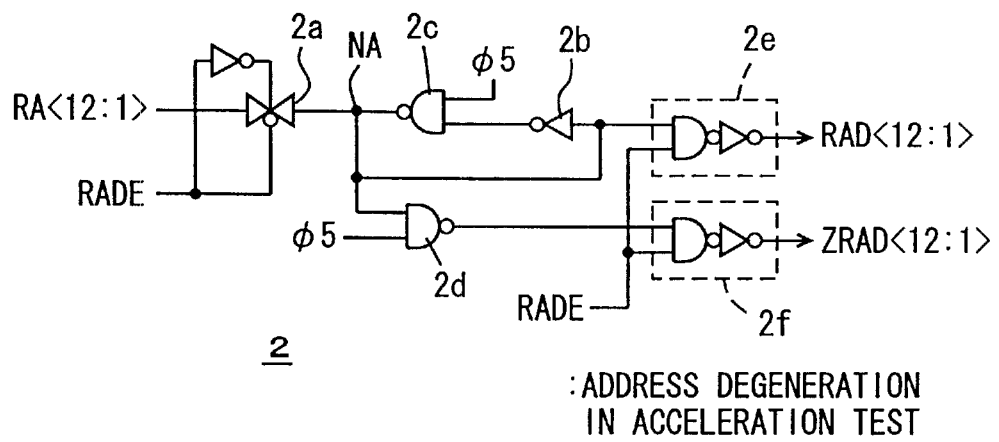
FIG. 15 shows a structure of an address buffer shown in FIG. 1.

FIG. 15 shows a structure of a circuit for 12-bit address signal RA <12:1> in address buffer 2 shown in FIG. 1. Referring to FIG. 15, the address buffer circuit includes a CMOS transmission gate 2a which transmits externally supplied row address signal bits RA <12:1> to a node NA when row address enable signal RADE is at L level, an inverter circuit 2b which inverts a signal on node NA, an NAND circuit 2c which receives an output signal of inverter circuit 2b and address control signal φ5 to supply its output signal to node NA, an NAND circuit 2d which receives a signal on node NA and address control signal φ5, an AND circuit 2e which receives a signal on node NA and row address enable signal RADE to generate internal address signal bits RAD <12:1>, and an AND circuit 2f which receives an output signal of NAND circuit 2d and row address enable signal RADE to generate complementary internal address signal bits ZRAD <12:1>.

In the normal operation mode, row address enable signal RADE is generated according to internal row address strobe signal RAS. In the acceleration test, row address enable signal RADE is generated according to test control signals φ0–φ2. When row address enable signal RADE attains H level, CMOS transmission gate 2a is set into the non-conductive state so that the address buffer circuit is set into the latching state. In the acceleration test, address control signal φ5 reaches L level and output signals of NAND circuits 2c and 2d attain H level. The signal(s) on node NA is latched by inverter circuits 2b and NAND circuit 2c. An output signal of NAND circuit 2c is supplied to AND circuit 2e, and an output signal of NAND circuit 2d is supplied to AND circuit 2f. Consequently, in the acceleration test, internal address signal bits RAD <12:1> and ZRAD <12:1> are all set at H level. Specifically, in this acceleration test, address signal bits RAD <12:1> and ZRAD <12:1> are set into a degenerate state (both selection state), and a memory block and a word line designated by these address signal bits are driven into the selected state.

In the normal operation mode, address control signal φ5 is at H level and NAND circuits 2c and 2d operate as an inverter circuit. Therefore, in the normal operation mode, internal address signal bits RAD <12:1> and ZRAD <12:1> are generated according to externally supplied address signal bit RA <12:1>.

Figure 16:
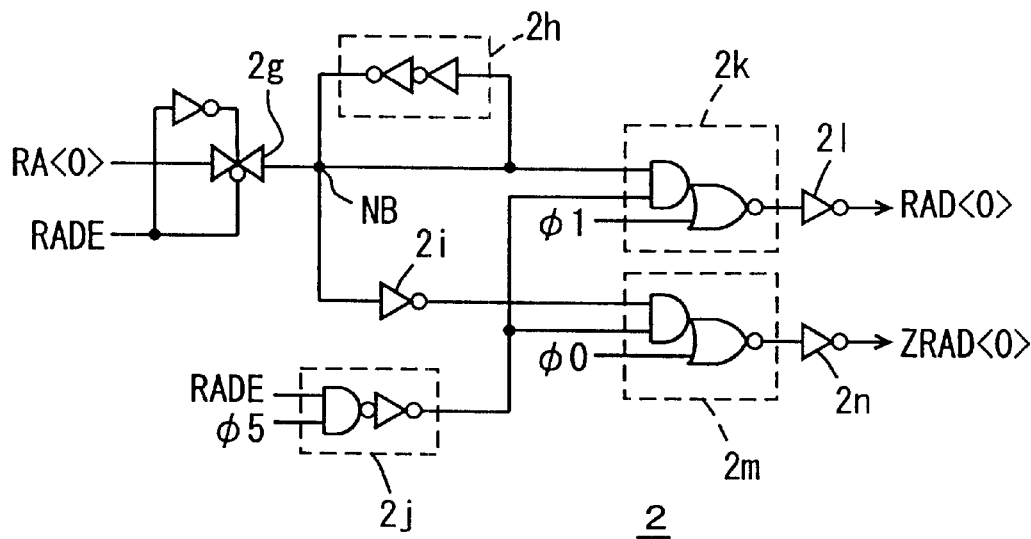
FIG. 16 shows a structure of the address buffer shown in FIG. 1.

FIG. 16 shows a structure of a circuit for address signal bit RA <0> in address buffer 2 shown in FIG. 1. Referring to FIG. 16, the address buffer circuit includes a CMOS transmission gate 2g which transmits externally supplied row address signal bit RA <0> to a node NB when row address enable signal RADE is at L level, a buffer circuit 2h formed of inverter circuits of two stages, for example, which transmits a signal on node NB to node NB to latch the signal on node NB, an inverter circuit 2i which inverts a signal on node NB, an AND circuit 2j which receives row address enable signal RADE and address control signal φ5, an AND/NOR composite gate 2k which receives a signal on node NB, an output signal of AND circuit 2j and test control signal φ1, an inverter circuit 21 which inverts an output signal of AND/NOR composite gate 2k to generate internal row address signal bit RAD <0>, an AND/NOR composite gate 2m which receives an output signal of inverter circuit 2i, an output signal of AND circuit 2j and test control signal φ0, and an inverter circuit 2n which inverts an output signal of AND/NOR composite gate 2m to generate complementary internal address signal bit ZRAD <0>.

AND/NOR composite gate 2k functionally includes an AND gate receiving a signal on node NB and an output signal of AND circuit 2j, and an NOR gate receiving an output signal of the AND gate and test control signal φ1.

AND/NOR composite gate 2m functionally includes an AND gate receiving an output signal of inverter circuit 2i and an output signal of AND circuit 2j, and an NOR gate receiving an output signal of the AND gate and test control signal φ0.

In the normal operation mode, address control signal φ5 is at H level and accordingly AND circuit 2j operates as a buffer circuit. According to row address enable signal RADE, external row address signal bit RA <0> is latched and internal row address signal bit RAD <0> and complementary row address signal bit ZRAD <0> are generated.

Figure 14:
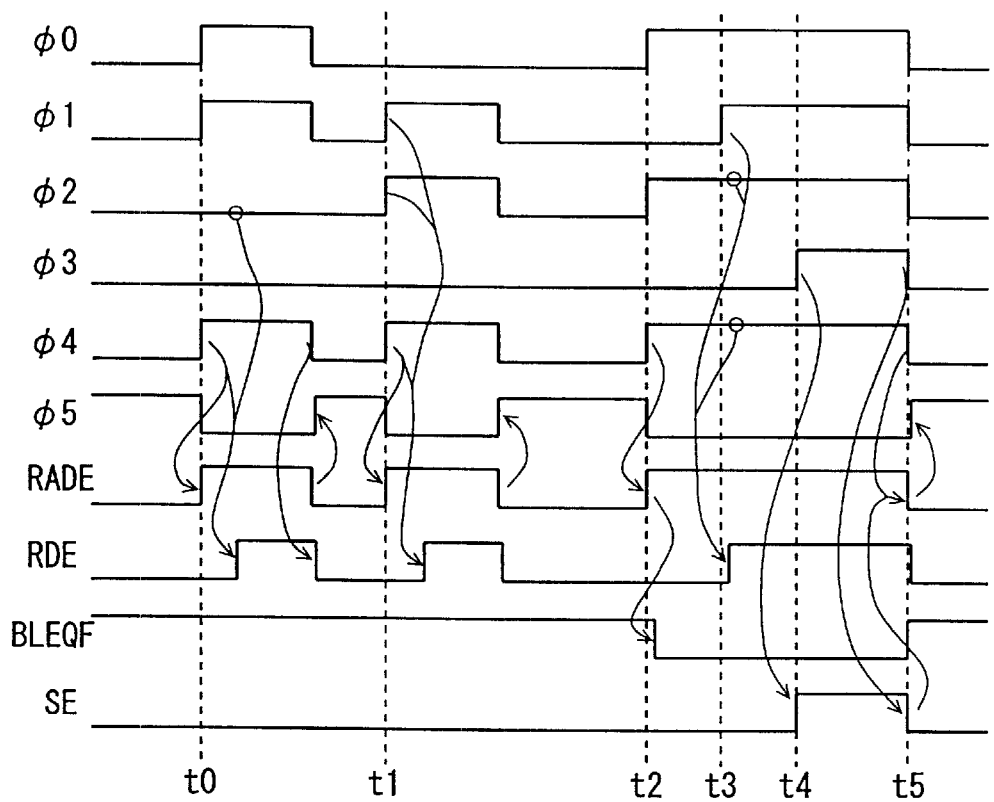
FIG. 14 is a timing chart representing an operation of the row-related control circuit with test control function shown in FIG. 13.

In the acceleration test, address control signal φ5 is set at L level when a row selecting operation is carried out (see FIG. 14). An output signal of AND circuit 2j is set at L level, and signals generated by inverting test control signals φ1 and φ0 are output from AND/NOR composite gates 2k and 2m, respectively. In other words, in the acceleration test, internal row address signal bits RAD <0> and ZRAD <0> are generated according to test control signals φ1 and φ0. When test control signals φ1 and φ0 are both set at H level, row address signal bit RAD <0> enters the degenerated state. By setting one of test control signals φ1 and φ0 at H level, a word line of an odd number or a word line of an even number can be selected as described later. In other words, in the memory cell array, one of word lines adjacent to each other is in the selected state and the other is in the non-selected state so that short-circuit between adjacent word lines can be accelerated.

Figure 17:
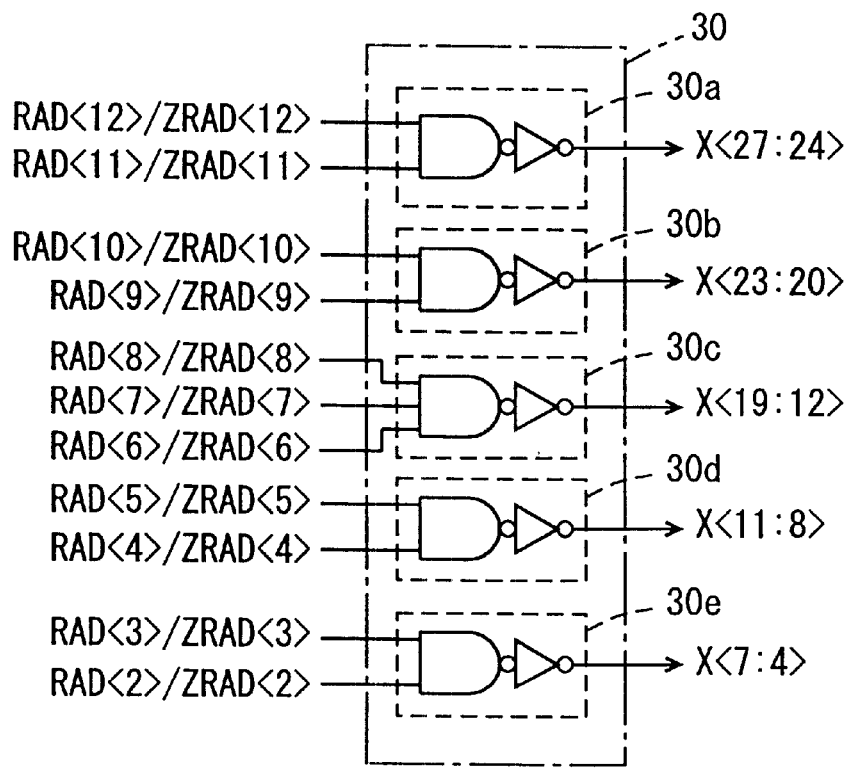
FIG. 17 illustrates a structure of a predecoder included in a row selection circuit shown in FIG. 1.

FIG. 17 shows a structure of a predecoder included in row selection circuit 3 shown in FIG. 1. Referring to FIG. 17, predecoder 30 includes an AND type predecode circuit 30a receiving address signal bit RAD <12> or ZRAD <12> and address signal bit RAD <11> or ZRAD <11> to generate predecode signals X <27:24>, an AND type predecode circuit 30b receiving address signal bit RAD <10> or ZRAD <10> and address signal bit RAD <9> or ZRAD <9> to generate predecode signals X <23:20>, an AND type predecode circuit 30c receiving address signal bit RAD <8> or ZRAD <8>, address signal bit RAD <7> or ZRAD <7>, and address signal bit RAD <6> or ZRAD <6> to generate predecode signals X <19:12>, an AND type predecode circuit 30d receiving address signal bit RAD <5> or ZRAD <5> and address signal bit RAD <4> or ZRAD <4> to generate predecode signals X <11:8>, and an AND type predecode circuit 30e receiving address signal bit RAD <3> or ZRAD <3> and address signal bit RAD <2> or ZRAD <2> to generate predecode signals X <7:4>.

Among sixteen memory blocks, a group of four memory blocks is specified by predecode signals X <27:24>. One memory block is specified by predecode signals X <23:20> in one memory block group. One of sixteen memory blocks is designated by predecode signals X <27:20>.

A group of four word lines in one memory block is selected by predecode signals X <19:4>. In this structure, a memory block has a hierarchical structure including main word lines and sub word lines, and four sub word lines are selected by one main word line as described later in detail. One main word line is designated by predecode signals X <19:4>.

In the address buffer circuit shown in FIG. 15, address signal bits RAD <12:1> and ZRAD <12:1> are set in the degeneration state, so that predecode signals X <27:4> are all set into selected state, sixteen memory blocks are all selected, and all main word lines in all the memory blocks are selected.

Figures 18A, 18B:
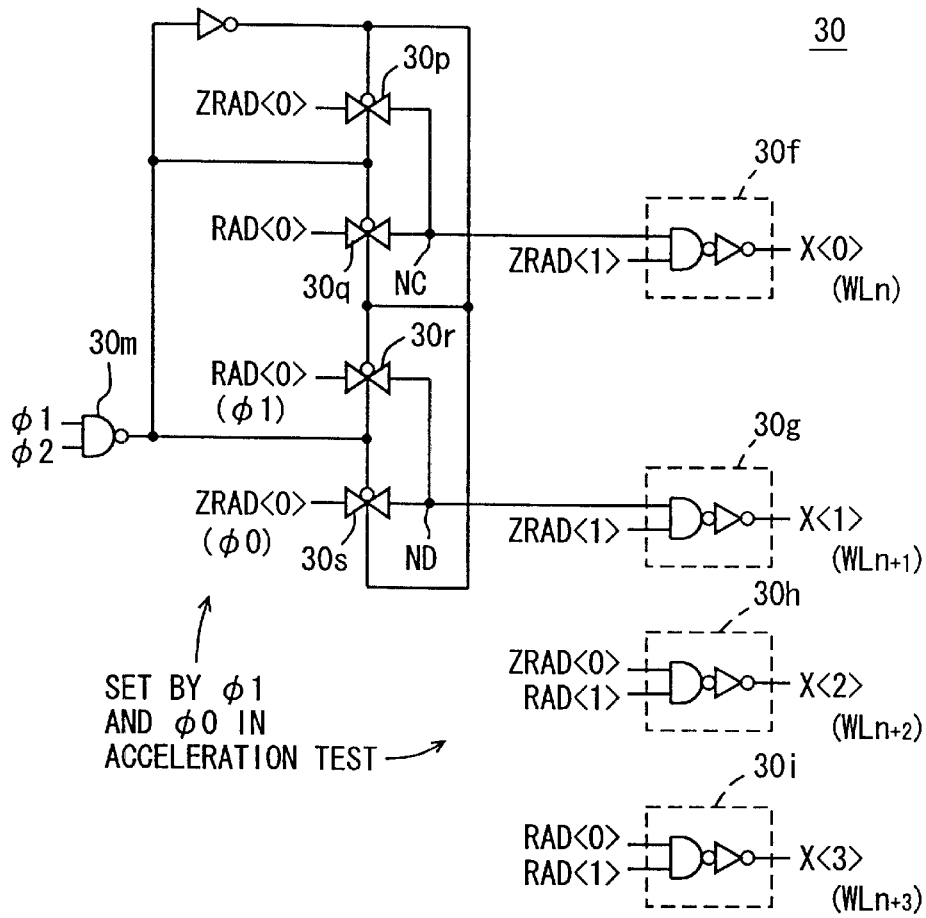
FIG. 18A shows a remaining structure of the predecoder of the row selection circuit shown in FIG. 1.
FIG. 18B shows input/output truth values of the predecoder shown in FIG. 18A.

FIG. 18A shows a structure of a portion generating predecode signal X <3:0> of the row predecoder. Referring to FIG. 18A, row predecoder 30 includes an NAND circuit 30m receiving test control signals φ1 and φ2, a CMOS transmission gate 30p rendered conductive, when an output signal of NAND circuit 30m is at H level, to transmit row address signal bit ZRAD <0> to a node NC, a CMOS transmission gate 30q rendered conductive, when an output signal of NAND circuit 30m is at L level, to transmit row address signal bit RAD <0> to node NC, a CMOS transmission gate 30r rendered conductive, when an output signal of NAND circuit 30m is at H level, to transmit row address signal bit RAD <0> to a node ND, a CMOS transmission gate 30s rendered conductive, when an output signal of NAND circuit 30m is at L level, to transmit row address signal bit ZRAD <0> to node ND, an AND type predecode circuit 30f receiving a signal on node NC and row address signal bit ZRAD <1> to generate predecode signal X <0>, an AND type predecode circuit 30g receiving a signal on node ND and address signal bit ZRAD <1> to generate predecode signal X <1>, an AND type predecode circuit 30h receiving address signal bits ZRAD <0> and RAD <1> to generate predecode signal X <2>, and an AND type predecode circuit 30i receiving address signal bits RAD <0> and RAD <1> to generate predecode signal X <3>. Predecode signals X <0>–X<3> designate word lines WLn–WLn+3, respectively.

FIG. 18B illustrates truth values of input/output signals of the predecoder shown in FIG. 18A. In the acceleration test, row address signal bit RAD <0> is generated according to test control signal φ1 while row address signal bit ZRAD <0> is generated according to test control signal φ0.

When test control signals φ0 and φ1 are both at H level and test control signal φ2 is at L level, address signal bits RAD <0> and ZRAD <0> both attain H level and predecode signals X<0>–X<3> all attain the selected state. Here, signal bits RAD <1> and ZRAD <1> are set into the selected state by address control signal φ5 in the acceleration test as shown in FIG. 15.

When test control signal φ0 is at L level and test control signals φ1 and φ2 are both at H level, address signal bit RAD <0> attains H level and predecode signals X<0> and X<3> are set into the selected state.

When test control signals φ0 and φ2 are at H level and test control signal φ1 is at L level, row address signal bit ZRAD <0> attains H level and CMOS transmission gates 30p and 30r are set into the conductive state. Accordingly, predecode signals X <0> and X<2> are driven into the selected state.

When test control signals φ0–φ2 are all at H level, the address bits attain H level and accordingly all predecode signals X<0>–X<3> are set into the selected state.

When test control signals φ0 and φ2 are at L level and test control signal φ1 is at H level, row address signal bit RAD <0> attains H level and CMOS transmission gates 30p and 30r are set into the conductive state. Accordingly, predecode signals X <1> and X <3> are driven into the selected state.

When test control signal φ0 is at H level and both of test control signals φ1 and φ2 are at L level, row address signal bit ZRAD <0> attains H level and CMOS transmission gates 30p and 30r are set into the conductive state. Consequently, predecode signals X <0> and C <2> are driven into the selected state.

Sense amplifier activation signal SE is driven into the active state when all test control signals φ0–φ3 are set at H level. By setting the states of test control signals φ0–φ2, word line WLn to be selected can be every second word line and every third word line. In this way, short-circuit between word lines can be accelerated.

Figure 19:
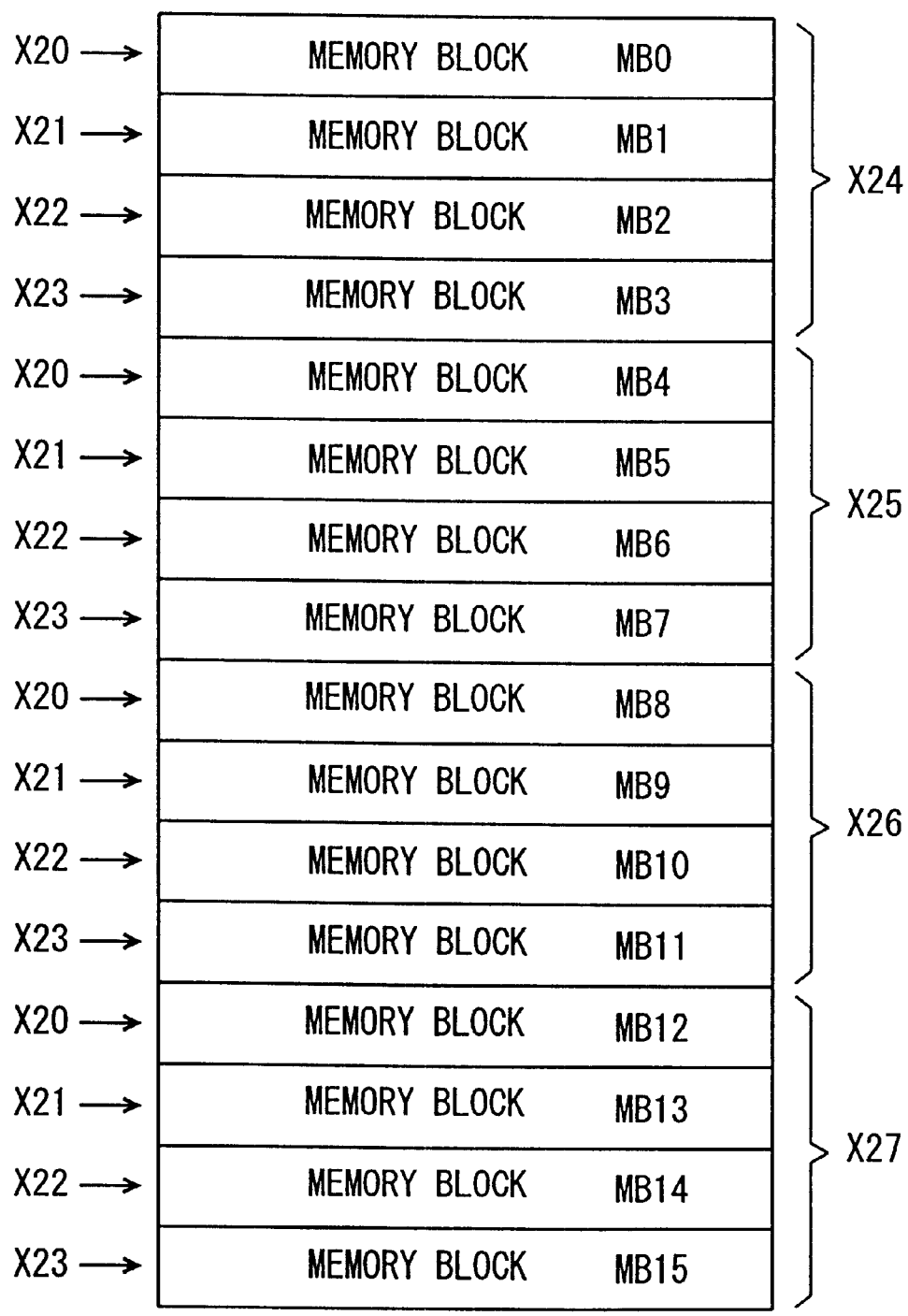
FIG. 19 represents a correlation between memory blocks and predecode signals.

FIG. 19 illustrates allocation of predecode signals to memory blocks. Sixteen memory blocks MB0–MB15 are placed in the memory array. Predecode signal X24 designates memory blocks MB0–MB3, predecode signal X25 designates memory blocks MB4–MB7, and predecode signal X26 designates memory blocks MB8–MB11. Predecode signal X27 designates memory block MB12–MB15.

Predecode signal X20 designates memory blocks MB0, MB4, MB8 and MB12. Predecode signal X21 designates memory blocks MB1, MB5, MB9 and MB13. Predecode signal X22 designates memory blocks MB2, MB6, MB10 and MB14. Predecode signal X23 designates memory blocks MB3, MB7, MB11 and MB15. One memory block is designated by predecode signals X20–X23 and X24–X27.

Figure 20:
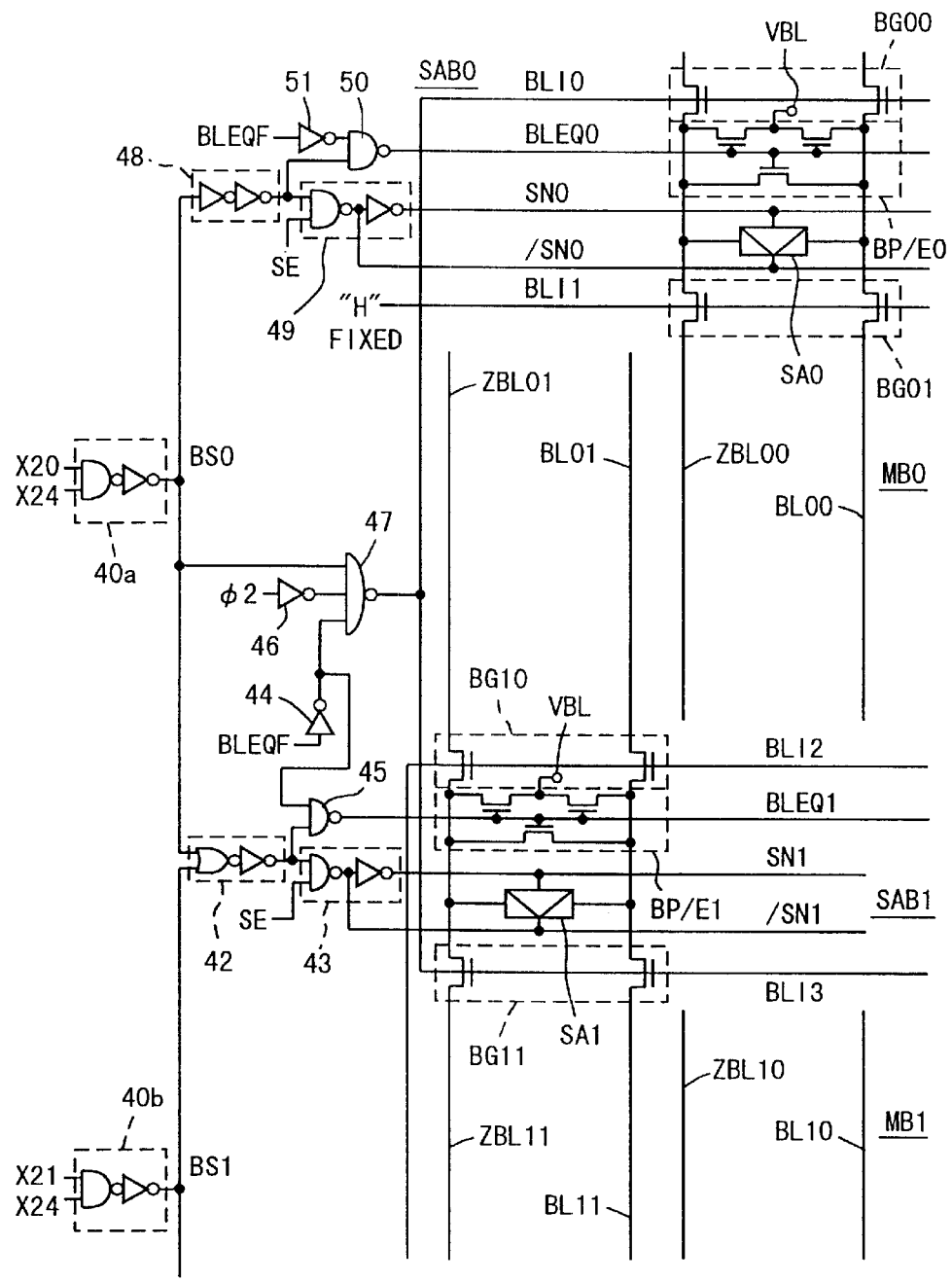
FIG. 20 shows structures of a sense amplifier band and a sense amplifier band control circuit of the semiconductor memory device according to the present invention.

FIG. 20 is schematic diagram showing a structure of peripheral circuitry of memory blocks MB0 and MB1. Referring to FIG. 20, memory block MB0 includes a pair of bit lines BL00 and ZBL00 and a pair of bit lines BL01 and ZBL01, and memory block MB1 includes a pair of bit lines BL10 and ZBL10 and a pair of bit lines BL11 and ZBL11.

In sense amplifier bands SAB0 and SAB1, sense amplifier circuits SA (SA0, SA1) are arranged alternately. Specifically, sense amplifier circuit SA0 is placed for bit lines BL00 and ZBL00 of memory block MB0 in sense amplifier band SAB0, and remaining sense amplifier circuits are similarly arranged at every second pair of bit lines in the sense amplifier band SAB0.

In sense amplifier band SAB1, sense amplifier circuit SA1 is placed for the pair of bit lines BL01 and ZBL01 of memory block MB0 and the pair of bit lines BL11 and ZBL11 in memory block MB1.

Bit line precharge/equalize circuits (bit line precharge circuits) BP/E0 and BP/E1 are arranged corresponding to sense amplifier circuits SA0 and SA1, respectively.

Sense amplifier circuit SA0 is coupled to bit lines BL00 and ZBL00 via a bit line isolation gate BG01. Sense amplifier circuit SA1 is coupled to bit lines BL01 and ZBL01 via a bit line isolation gate BG10 and coupled to bit lines BL11 and ZBL11 via a bit line isolation gate BG11.

A bit line isolation gate BG00 receives bit line isolation instruction signal BLI0 and bit line isolation gate BG01 receives bit line isolation instruction signal BLI1 fixed at H level. Bit line isolation gates BG10 and BG11 respectively receive bit line isolation instruction signals BLI2 and BLI3.

Bit line isolation instruction signals BLI0 and BLI3 are identical to each other. Bit line isolation gate BG00 is provided in order to provide the same load to the bit line isolation instruction signal as that in another memory block (no memory block is placed outside sense amplifier band SAB0.)

Bit line isolation instruction signal BLI1 is fixed at H level in order to couple memory block MB0 to sense amplifier band SAB0 all the time.

A row-related control circuit is provided in order to control an operation of the bit line peripheral circuitry of these sense amplifier bands.

Specifically, for memory block MB0, an AND type block decoder 40a receiving predecode signals X20 and X24 and an AND type block decoder 40b receiving predecode signals X21 and X24 are provided. Block selection signals BS0 and BS1 are output from block decoders 40a and 40b respectively for indicating that memory blocks MB0 and MB1 are selected.

Sense amplifier band SAB0 is provided with a buffer circuit 48 receiving block selection signal BS0, an NAND circuit 50 receiving an output signal of buffer circuit 48 and inverted bit line equalize control signal BLEQF from an inverter 51 to generate local bit line equalize instruction signal BLEQ0 and supply it to bit line precharge/equalize circuit BP/E0, and a local sense amplifier drive circuit 49 generating sense amplifier drive signals SN0 and ISN0 complementary to each other according to an output signal of buffer circuit 48 and sense amplifier activation signal SE.

In order to generate bit line isolation instruction signals BLI0 and BLI3, an inverter 46 receiving test control signal $\phi2$, an inverter 44 receiving bit line equalize control signal BLEQF, and an NAND circuit 47 receiving output signals of inverters 44 and 46 and block selection signal BS0 are provided. Bit line isolation instruction signals BLI0 and BLI3 are output from NAND circuit 47.

Sense amplifier band SAB1 is provided with an OR circuit 42 receiving block selection signals BS0 and BS1, an NAND circuit 45 receiving an output signal of OR circuit 42 and an output signal of inverter 44 to generate local bit line equalize instruction signal BLEQ1 and supply it to bit line precharge/equalize circuit BP/E1, and a local sense amplifier drive circuit 43 receiving sense amplifier activation signal SE and an output signal of OR circuit 42 to generate sense amplifier drive signals SN1 and /SN1 complementary to each other.

Bit line isolation instruction signal BLI2 is supplied from another NAND circuit 47 provided for memory block MB1.

In the normal operation mode, one block selection signal BSi is driven into the selected state according to predecode signals X20–X27. Suppose now that block selection signal BS0 is in the selected state of H level and block selection signal BS1 is in the non-selected state of L level. In the normal operation mode, test control signal $\phi2$ is at L level. When internal row address strobe signal RAS attains the active state of H level, bit line equalize instruction signal BLEQF falls to L level and an output signal of inverter circuit 44 attains H level. Responsively, bit line isolation instruction signals BLI0 and BLI3 supplied from NAND circuit 47 fall to L level and bit line isolation gates BG00 and BG11 are set into the non-conductive state. In this state, sense amplifier circuit SA1 of sense amplifier band SAB1 and each bit line of memory block MB1 are isolated from each other. On the other hand, since block selection signal BS1 is at L level, bit line isolation instruction signal BLI2 is maintained at H level and bit line isolation gate BG10 is maintained in the conductive state. Accordingly, bit lines BL01 and ZBL01 of memory block MB0 are connected to sense amplifier circuit SA1.

When bit line equalize instruction signal BLEQF falls to L level, an output signal of inverter 44 attains H level, OR circuit 42 outputs a signal at H level according to block selection signal BS0, local bit line equalize instruction signal BLEQ1 from NAND circuit 45 is set into the inactive state of L level, and bit line precharge/equalize circuit BP/E1 is set into the inactive state. An output signal of buffer circuit 48 is at H level and bit line equalize instruction signal BLEQ0 from NAND circuit 50 reaches L level. Then, a word line is selected in selected memory block MB0. Then, when sense amplifier activation signal SE rises to H level, sense amplifier drive signals SN0,SN1 and /SN1, /SN1 are driven into the active states of H level and L level, respectively (Output signal of OR circuit 42 is at H level.)

In the acceleration test, all predecode signals X20–X27 are driven into the selected state and all block selection signals BS0–BS15 are driven into the selected state.

When test control signal $\phi2$ is at L level, an output signal of inverter 46 is at H level. However, in the acceleration test, when test control signal $\phi2$ is set at L level, bit line equalize instruction signal BLEQF is maintained at H level (see the waveform diagram in FIG. 14) and the bit line isolation instruction signals BLI0 and BLI3 from NAND circuit 47 are maintained at H level. This operation is similarly done for other bit line isolation instruction signals and accordingly, all bit line isolation gates in all the sense amplifier bands are in the conductive state.

Since bit line equalize instruction signal BLEQF is maintained at H level, local bit line equalize instruction signal BLEQ1 from NAND circuit 45 is at H level, local bit line equalize instruction signal BLEQ0 from NAND circuit 50 is maintained at H level because of L level of an output signal of inverter circuit 51. In this state, bit line precharge voltage VBL is driven into the ground voltage level so as to transmit the voltage of L level to each bit line. In the first test mode, sense amplifier activation signal SE is maintained in the inactive state in the acceleration test and sense amplifier drive signals SN0, /SN0, SN1, /SN1, . . . are all in the inactive state as clearly shown in the signal waveform diagram in FIG. 14.

In operation 2 of the first test mode, when test control signal $\phi2$ is set at H level, an output signal of NAND circuit 47 attains H level and similarly bit line isolation instruction signals BLI0–BLI3, . . . are all at H level so that the bit line isolation gate is maintained in the conductive state. In this state, predecode signals X20–X27 are all set in the selected state and bit line precharge voltage VBL is set at H level. Subsequently, a word line is selected in each memory block and H level data is written into a memory cell connected to bit line BL. In this operation, bit line equalize instruction signal BLEQF is at H level.

In operation 3 of the first test mode, test control signal $\phi2$ is set at H level so that bit line isolation instruction signals BLI–BLI3, . . . output by NAND circuit 47 are all at H level, bit line isolation gates are all in the conductive state and each bit line is coupled to a sense amplifier circuit. However, in the state of operation 3, both of test control signals $\phi0$ and $\phi2$ are set at H level, and bit line equalize instruction signal BLEQF falls to L level. Since block selection signals BS0–BS15 are all in the selected state, local bit line equalize instruction signals BLEQ0 and BLEQ1 output by NAND circuits 50 and 45 fall to L level in response to falling of bit line equalize instruction signal BLEQF, bit line precharge/equalize circuits BP/E0 and BP/E1 reach the inactive state, and thus bit lines are all in the floating state in each memory block.

In the state of operation 4 of the first test mode, word line selection is effected according to test control signal $\phi1$, and sense amplifier activation signal SE is activated according to test control signal $\phi3$ in operation 5. Since block selection signals BS0–BS15 are all in the selected state, local sense amplifier drive signals SN0, /SN0, SN1, /SN1, . . . are all driven into the active state, according to activation of sense amplifier activation signal SE, to implement sense operation. In this state, the level of power supply voltage applied to the sense amplifier circuit is raised to accelerate voltage stress applied between memory cell capacitors.

In the structure shown in FIG. 20, the test control signals are used to selectively activate block selection signals BS0–BS15, bit line equalize instruction signal BLEQF and sense amplifier activation signal SE. Consequently, the sequence from operation 1 to operation 5 can correctly be implemented.

Structure of Memory Block

Figure 21:
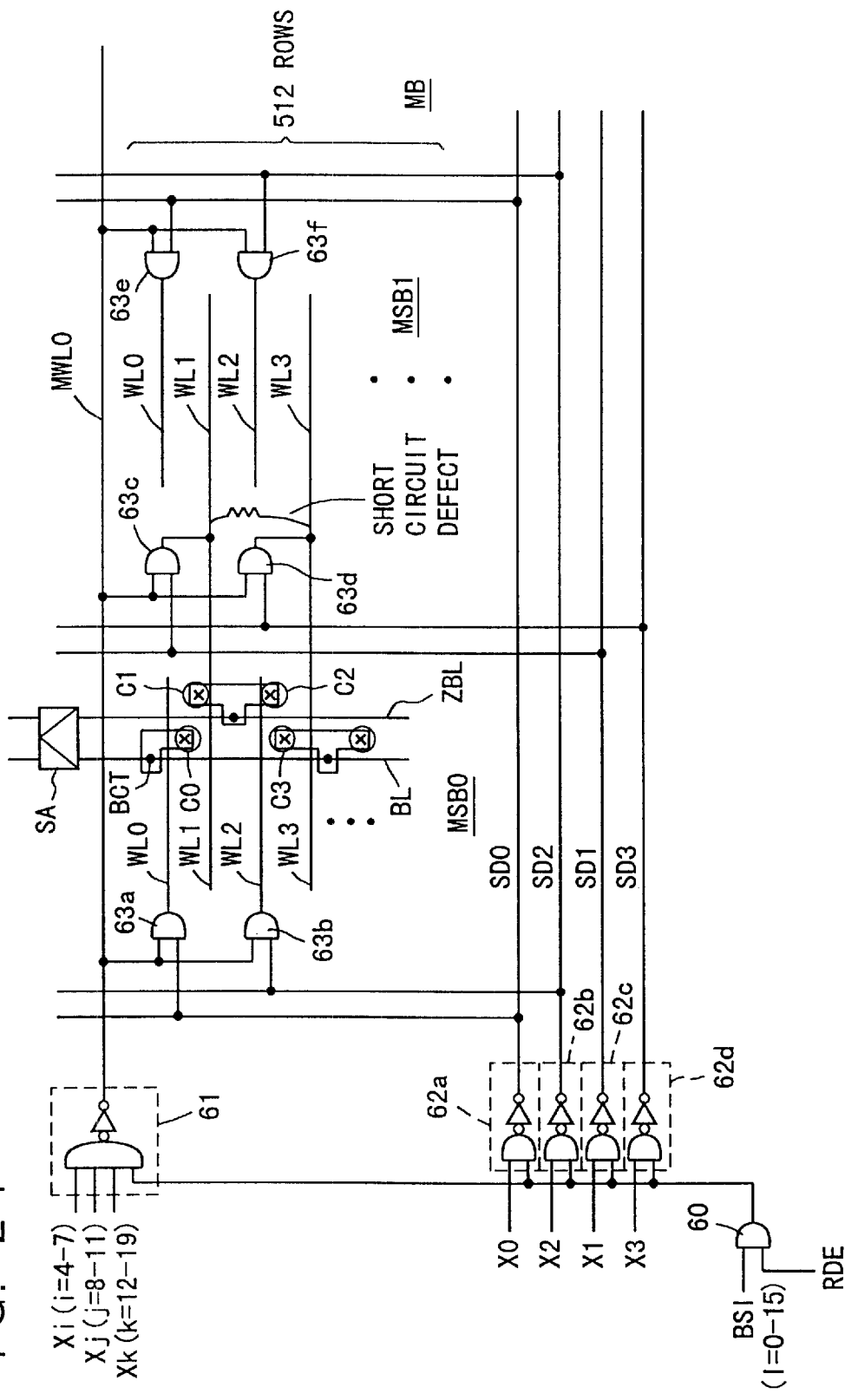
FIG. 21 is a schematic diagram showing a structure of a memory block of the semiconductor memory device according to the present invention.

FIG. 21 is a schematic diagram showing a structure of a portion related to one memory block MB. Memory block MB is divided into a plurality of memory sub blocks MSB in the row direction. FIG. 21 representatively shows two memory sub blocks MSB0 and MSB1.

In memory block MB, a main word line MWL is placed in the row direction and shared by the memory sub blocks. FIG. 21 representatively shows one main word line MWL0. For one main word line MWL0, four sub word lines WL0–WL3 are arranged in each of memory sub blocks MSB0, MSB1, . . . Memory cells are arranged in rows and columns in memory sub blocks MSB0, MSB1,. To each of sub word lines WL0–WL3, memory cells of a corresponding row in a corresponding memory sub block are connected. FIG. 21 shows memory cells arranged at crossings of one pair of bit lines BL and ZBL and word lines WL0–WL3 in memory sub block MSB0. These memory cells include memory cell capacitors C0–C3. Each of the memory cells is connected to bit line BL or bit line ZBL via a bit line contact BCT. Each of memory cell capacitors C0–C3 is connected to an access transistor via a contact indicated by the mark "x" in FIG. 21.

As shown in FIG. 21, memory cells connected to bit line BL are also connected to (sub) word lines WL0 and WL3, and memory cells connected to bit line ZBL are also connected to (sub) word lines WL1 and WL2. This pattern is repeated in the row and column directions.

Although the pair of bit lines BL and ZBL is connected to sense amplifier circuit SA via a bit line isolation gate, the bit line isolation gate is not shown in FIG. 21.

In order to select a main word line, an AND circuit 60 receiving row decoder enable signal RDE and block selection signal BS1 (1=0–15) to generate a block activation signal, and an AND type decode circuit 61 receiving the block activation signal from AND circuit 60 and predecode signals Xi (i=4–7), Xj (j=8–11) and Xk (k=12–19) are provided. When predecode signals Xi, Xj and Xk are all in the selected state of H level, addressed main word line MWL (MWL0) is driven into the selected state according to the block activation signal.

One main word line MWL causes a set of four sub word lines WL0–WL3 to be selected in each of memory sub blocks MSB0, MSB1, . . . of memory block MB. In order to select one sub word line WL from the four sub word lines WL0–WL3, a sub predecode circuit 62a receiving the block activation signal from NAND circuit 60 and predecode signal X0 to generate sub decode signal SD0, a sub predecode circuit 62b receiving the block activation signal and predecode signal X2 to generate sub decode signal SD2, a sub predecode circuit 62c receiving the block activation signal and predecode signal X1 to generate sub decode signal SD1, and a sub predecode circuit 62d receiving the block activation signal and predecode signal X3 to generate sub decode signal SD3 are provided. Sub decode signals SD0–SD3 respectively from sub predecode circuits 62a–62d are transmitted in the row direction over memory block MB.

Concerning sub decode signals SD0–SD3, a set of two sub decode signals SD0 and SD2 and a set of two sub decode signals SD1 and SD3 are alternately transmitted in the column direction in the regions between the adjacent memory sub blocks.

In memory sub block MSB0, an AND type sub word line drive circuit 63a receiving a signal on main word line MWL0 and sub decode signal SD0 is provided for word line WL0, and an AND type sub word line drive circuit 63b receiving a signal on main word line MWL0 and sub decode signal SD2 is provided for sub word line WL2.

In the region between memory sub blocks MSB0 and MSB1 (sub word driver band), an AND type sub word line drive circuit 63c receiving a signal on main word line MWL0 and sub decode signal SD1 is commonly provided to sub word lines MWL1 of memory sub blocks MSB0 and MSB1, and an AND type sub word line drive circuit 63d receiving a signal on main word line MWL0 and sub decode signal SD3 is commonly provided to sub word lines WL3 of memory sub blocks MSB0 and MSB1.

In memory sub block MSB1, an AND type sub word line drive circuit 63e receiving a signal on main word line MWL0 and sub decode signal SD0 is provided to sub word line WL0, and an AND type sub word line drive circuit 63f receiving a signal on main word line MWL0 and sub decode signal SD2 is provided to sub word line WL2. Sub word line drive circuits 63e and 63f are arranged opposite to sub word line drive circuits 63c and 63d. Sub word line drive circuits 63e and 63f drive sub word lines WL0 and WL2 of a memory sub block (MSB2) (not shown).

On both sides of memory sub block MSB in the row direction, sub word line drive circuits are alternately arranged in order to alleviate the pitch condition of the sub word line drive circuits.

In the memory block structure shown in FIG. 21, in the normal operation mode, one main word line MWL is driven into the selected state according to block selection signal BS1 and predecode signals Xi, Xj and Xk. One of predecode signals X0–X3 is driven into the selected state and one of sub decode signals SD0–SD3 is driven into the selected state. In this way, one sub word line is driven into the selected state in each memory sub block MSB of memory block MB.

In the acceleration test, block selection signal BS1 is driven into the selected state for all blocks. All predecode signals Xi, Xj and Xk are also driven into the selected state so that main word lines MWL are simultaneously driven into the selected state in all the blocks. According to test control signals $\phi 1$–$\phi 2$, predecode signals X0–X3 are all driven into the selected state in the first operation 1 of the acceleration test. Accordingly, sub decode signals SD0–SD3 are all driven into the selected state and all sub word lines WL0–WL3 are selected. In other words, all memory cells are selected. In this state, voltage at L level is transmitted to bit lines BL and ZBL.

In operation 2 of the acceleration test, predecode signals Xi, Xj and Xk are all driven into the selected state and block selection signal BS1 is driven into the selected state. According to test control signals $\phi 0$–$\phi 2$, predecode signals X0 and X3 are driven into the selected state and accordingly sub decode signals SD0 and SD3 are driven into the selected state. In this way, in memory sub blocks MSB0, MSB1, . . . , sub word lines WL0 and WL3 are driven into the selected state so that data of H level are written into memory cells connected to bit line BL.

In the state of operation 2, sub word line WL1 is in the non-selected state of L level while sub word line WL3 is in the selected state of H level. Therefore, the voltage level transmitted onto the word line can be raised in this state to accelerate latent short-circuit due to any particle between sub word lines WL1 and WL3 to reveal this short-circuit defect. This is hold for potential short-circuit defects between sub word lines WL0 and WL1 and sub word lines WL2 and WL3. In this way, these test control signals can be used to effect an acceleration test for detecting short-circuit defects between sub word lines.

In operation 3, according to test control signals φ0–φ2, predecode signals X0 and X2 are selected and remaining predecode signals Xi, Xj and Xk and block selection signal BS1 are all driven into the selected state. However, as shown in the signal waveform diagram in FIG. 14, row decoder enable signal RDE is in the inactive state so that no row selecting operation is performed, a memory sub blocks are in the precharged state and bit lines BL and ZBL are in the electricity floating state.

In operation 4, according to test control signals φ0–φ2, all predecode signals X0–X3 are driven into the selected state and accordingly sub decode signals SD0–SD3 are all driven into the selected state. Responsively, sub word lines WL0–WL3 are all driven into the selected state and H level data and L level data on bit lines BL and ZBL are latched by sense amplifier circuit SA (in operation 5). By raising the power supply voltage of sense amplifier circuit SA, voltage stress acceleration can be implemented for an interlayer insulating film between adjacent memory capacitors C0 and C1 and for an interlayer insulating film between adjacent memory cell capacitors C2 and C3.

Instead of acceleration of the voltage stress on the interlayer insulating film between adjacent memory cell capacitors, an acceleration test discussed below can be performed as a second test mode. According to test control signals, predecode signals X1 and X3 or signals X0 and X2 are selectively set into the selected state so that sub word lines WL0 and WL2 or sub word lines WL1 and WL3 are selected. There is a sub word line in the non-selected state between sub word lines in the selected state. In this case, short-circuit defect between adjacent sub word lines can be accelerated to reveal a potential short-circuit defect and allow screening of a short-circuit defect between sub word lines to be performed.

In this way, test control signals φ0–φ3 can be used to perform an acceleration test in which voltage stress is applied to adjacent memory cell capacitors and perform an acceleration test of word line voltage. (In operation 1, if word line voltage acceleration is effected, voltage stress on gate insulating films of all memory cell transistors can be accelerated since all sub word lines are in the selected state.)

Structure of Accelerating Voltage Generating Unit

Figure 22:
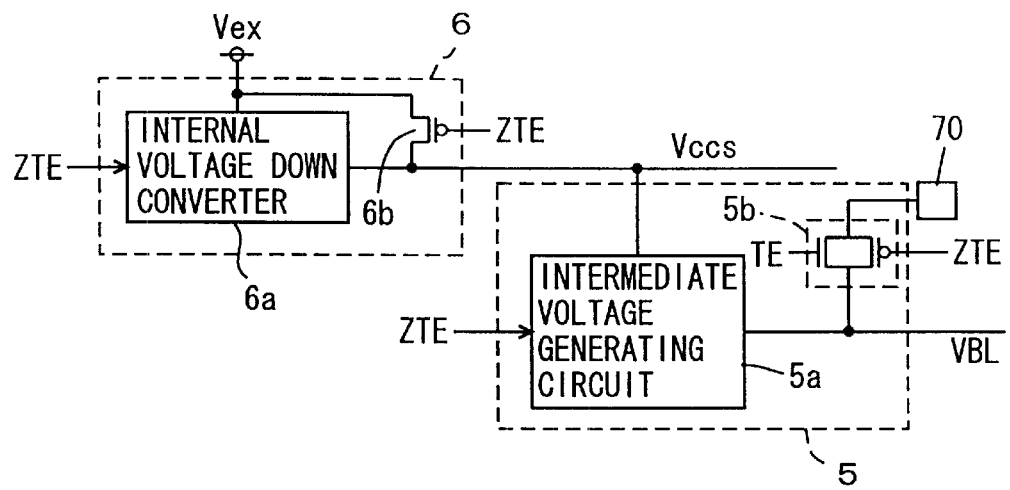
FIG. 22 is a schematic diagram showing structures of a VBL generating circuit and a sense amplifier power supply circuit shown in FIG. 1.

FIG. 22 is a schematic diagram showing structures of sense amplifier power supply circuit 6 and VBL generating circuit 5 shown in FIG. 1. Referring to FIG. 22, sense amplifier power supply circuit 6 includes an internal voltage-down converter 6a which operates, when inverted signal ZTE of test mode instruction signal TE is inactivated, to down-convert an external supply voltage Vex and generate sense power supply voltage Vccs, and a transfer gate 6b formed of a p channel MOS transistor and rendered conductive, when complementary test mode instruction signal ZTE is in the active state (L level), to transmit external power supply voltage Vex to a sense power supply line. Internal voltage-down converter 6a compares sense power supply voltage Vccs with reference voltage and applies current from an external power supply node to the sense power supply line according to the result of the comparison. When complementary test mode instruction signal ZTE reaches the active state of L level, the comparing operation is stopped and the current drive transistor is driven into OFF state.

VBL generating circuit 5 includes an intermediate voltage generating circuit 5a which operates, when complementary test mode instruction signal ZTE is inactivated, to generate from sense power supply voltage Vccs intermediate voltage Vccs/2 and output it as bit line precharge voltage VBL, and a CMOS transmission gate 5b which is rendered conductive, when test mode instruction signals TE and ZTE are activated, to transmit the voltage supplied to a pad 70 as bit line precharge voltage VBL.

Intermediate voltage generating circuit 5a is set into an output high impedance state, when complementary test mode instruction signal ZTE is in the active state, to have its intermediate voltage generating operation stopped. Pad 70 may be any appropriate pad in a burn-in test at a wafer level. In a burn-in test after packaging, pad 70 is the one connected to a pin terminal which is not used in the burn-in test, and bit line precharge voltage is externally applied via the unused pin terminal.

If intermediate voltage generating circuit 5a is not set into the output high impedance state when its voltage generating operation is stopped, a CMOS transmission gate which is rendered conductive complementarily to CMOS transmission gate 5b may be placed at an output portion of intermediate voltage generating circuit 5a. The reason why CMOS transmission gate 5b is employed is the need of transmitting both of the ground voltage and supply voltage Vcc (which may not be equal to sense supply voltage) as bit line precharge voltage VBL.

Employment of the structure shown in FIG. 22 enables the voltage level of sense power supply voltage Vccs to be changed according to test mode instruction signals ZTE and TE in an acceleration test such as the burn-in test and enables bit line precharge voltage VBL to be set at a desired voltage level.

Figure 23:
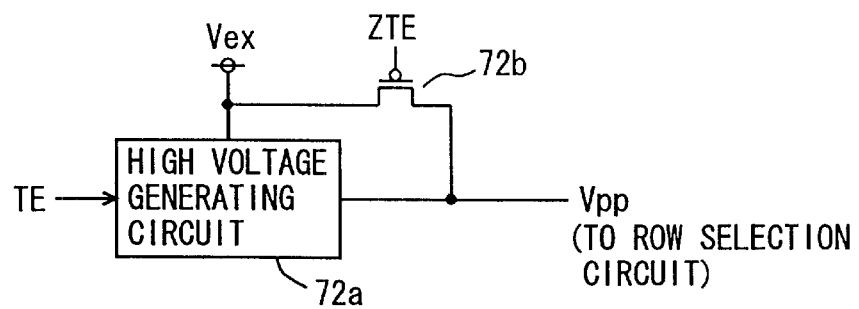
FIG. 23 is a schematic diagram showing a structure of a high voltage generating unit.

FIG. 23 is a schematic diagram showing a structure of a circuit generating high voltage Vpp transmitted onto a selected word line. Referring to FIG. 23, the word line drive voltage generating unit includes a high voltage generating circuit 72a which operates, when test mode instruction signal TE is inactivated, to generate high voltage Vpp from external supply voltage Vex, and a transfer gate 72b formed of a p channel MOS transistor and rendered conductive, when test mode instruction signal ZTE is activated, to transmit external supply voltage Vex as boosted voltage. High voltage Vpp is supplied to the row selection circuit and the H level of a selected word line (sub word line) is set at high voltage Vpp level. In this acceleration test, external supply voltage Vex can be transmitted as high voltage Vpp to accelerate voltage stress between the word lines and the memory cell capacitors. It is noted that external supply voltage Vex applied to sense amplifier power supply circuit 6 and the external supply voltage applied to high voltage generating circuit 72a may be equal to or different from each other.

High voltage generating circuit 72a is formed of a charge pump circuit, for example, utilizing a charge pump operation of a capacitor. When test mode instruction signal TE attains the active state, this charge pump operation is stopped. Usually high voltage generating circuit 72a has, at its output portion, a clamp circuit for keeping the voltage level of high voltage Vpp constant. High voltage generating circuit 72a sets the clamp circuit in the non-conductive state and is set in the output high impedance state when test mode instruction signal TE is activated. Alternatively, high voltage generating circuit 72a may have, at its output portion, a selection gate (transfer gate or transmission gate) for setting the output high impedance which is selectively rendered conductive in response to test mode instruction signal TE (and/or ZTE).

Figure 24:
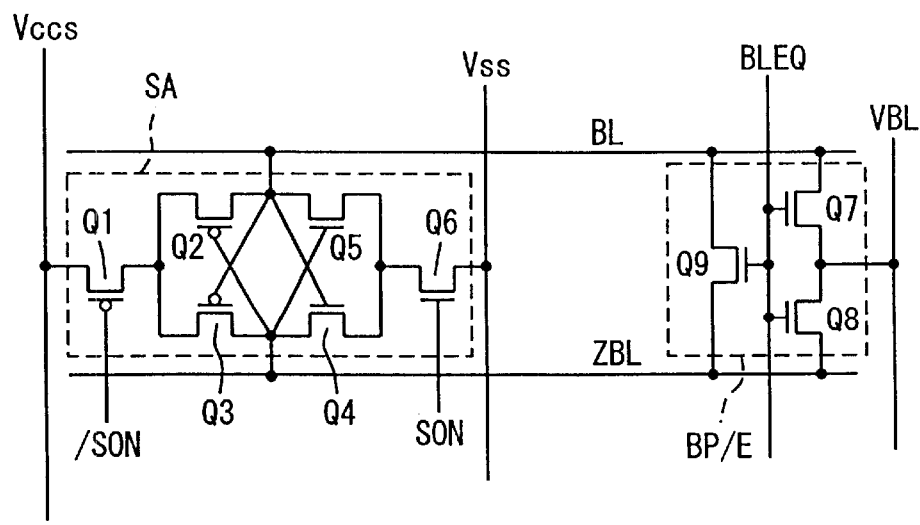
FIG. 24 shows a structure of bit line peripheral circuitry in the semiconductor memory device according to the present invention.
Figure 25:
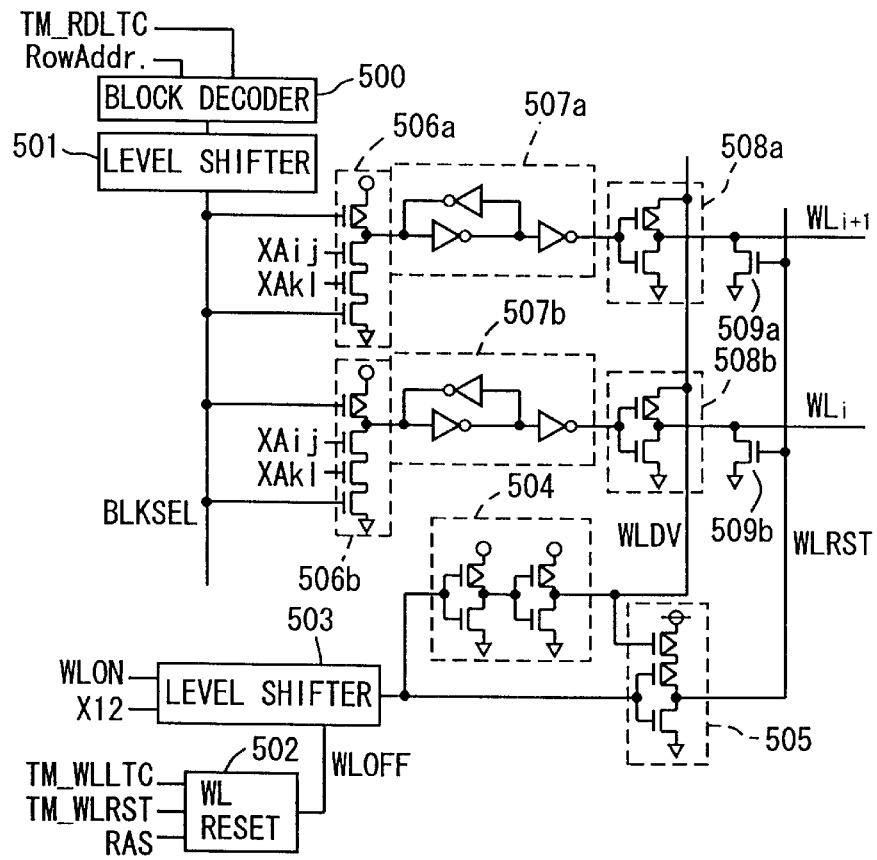
FIG. 25 shows a structure of a row selection circuit of a conventional semiconductor memory device.
Figure 26:
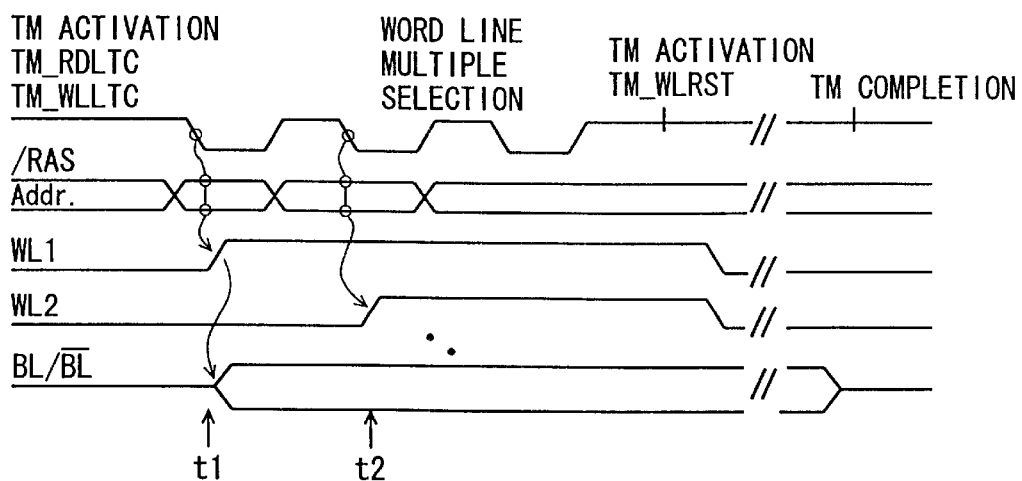
FIG. 26 is a signal waveform diagram representing an operation of the row selection circuit shown in FIG. 25.
Figure 27:
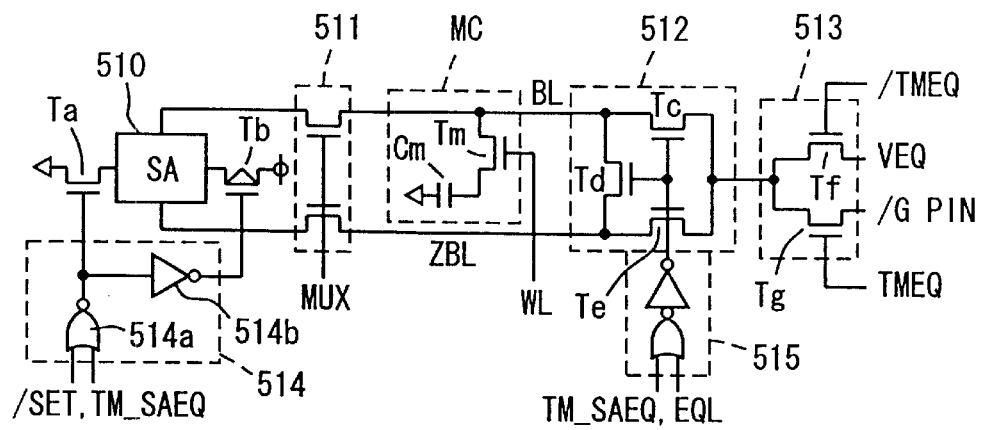
FIG. 27 is a schematic diagram showing a structure of the bit line peripheral circuitry of the conventional semiconductor memory device.
Figure 28:
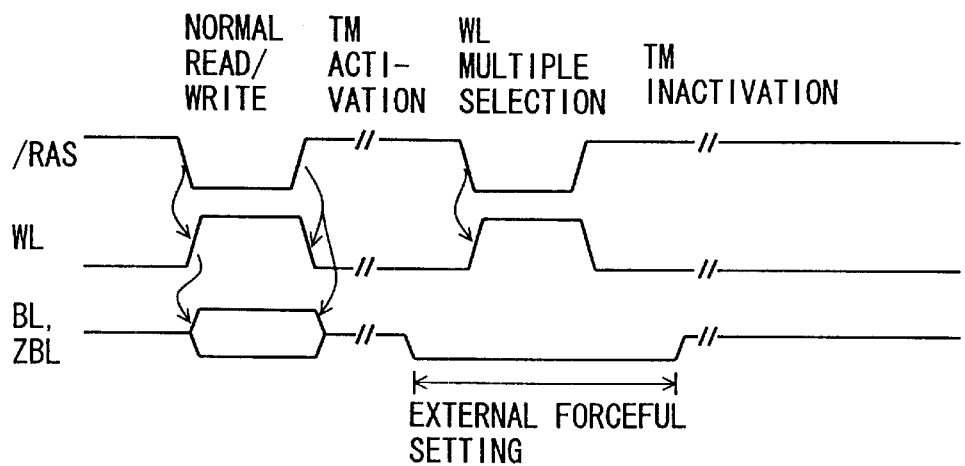
FIG. 28 is a signal waveform diagram representing an operation of the bit line peripheral circuitry shown in FIG. 27.

FIG. 24 illustrates a structure of peripheral circuitry of bit lines BL and ZBL. FIG. 24 shows no bit line isolation gate. A sense amplifier circuit SA includes p channel MOS transistors Q2 and Q3 having gates and drains cross-coupled to each other, n channel MOS transistors Q4 and Q5 having gates and drains cross-coupled to each other, a sense drive transistor Q1 rendered conductive, when sense amplifier activation signal /SON is activated, to transmit sense power supply voltage Vccs to source nodes of MOS transistors Q2 and Q3, and a sense amplifier drive transistor Q6 rendered conductive, when sense amplifier activation signal SON is activated, to transmit ground voltage Vss to the sources of MOS transistors Q4 and Q5.

Bit line precharge/equalize circuit BP/E includes MOS transistors Q7–Q9 which become conductive in response to bit line equalize instruction signal BLEQ. When MOS transistors Q7 and Q8 are conductive, bit line precharge voltage VBL is transmitted to bit lines BL and ZBL.

Accordingly, the voltage level of bit line precharge VBL can be changed to change the voltage levels of bit lines BL and ZBL via bit line precharge/equalize circuit BP/E. In a sensing and amplifying operation, the level of sense power supply voltage Vccs can be changed to change the bit line voltage level of H level on one of bit lines BL and ZBL.
Other Structures In operations 1 and 2, data of L level are first written into all the memory cells and thereafter data of H level are written into memory cells connected to bit line BL. On the contrary, L level data may be written into memory cells connected to bit line BL or ZBL after data of H level are written into all memory cells.

It is merely required that data stored in a memory cell connected to bit line BL and data stored in a memory cell connected to bit line ZBL have different logic levels.

Any of a standard DRAM, a logic-merged DRAM and a clock synchronous type DRAM may be employed as the semiconductor memory device.

In addition to the burn-in test, a life test may be performed as the acceleration test.

As discussed above, according to the present invention, a small number of control signals are utilized to determine an internal row address and generate an internal operation control signal. Therefore, external application of an address signal is unnecessary, the number of pins of a tester can be decreased and a high speed acceleration test can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns;
   a plurality of pairs of bit lines arranged corresponding to said columns and each connected to memory cells of a corresponding column, each of the pair of bit lines including first and second bit lines transmitting data signals complementary to each other in a normal access mode, each memory cell of each of said columns being connected to one of said first and second bit lines of a corresponding pair of bit lines;
   a plurality of word lines arranged corresponding to said rows and each connected to memory cells of a corresponding row, the word lines including a first word line connected to a memory cell connected to the first bit line and a second word line connected to a memory cell connected to the second bit line;
   a plurality of sense amplifier circuits arranged corresponding to said columns and activated to sense and amplify data in memory cells on corresponding columns;
   a plurality of bit line precharge circuits arranged corresponding to said columns, coupled to a voltage transmission line, and each activated to transmit voltage on said voltage transmission line to a pair of bit lines of a corresponding column; and
   a test control circuit for activating the bit line precharge circuits and driving simultaneously, into selected state, a first predetermined number of word lines among said plurality of word lines in a first test mode operation, and inactivating said plurality of bit line precharge circuits, driving simultaneously, into selected state, said plurality of word lines and activating said plurality of sense amplifier circuits in a second test mode operation following the first test mode operation,
   wherein said test control circuit further comprises
      means configured for driving the first word lines into the selected state when a first test instruction signal is activated in said first test mode operation,
      means configured for setting the voltage on said voltage transmission line at voltage of a first logic level when said first test instruction signal is activated, and
      means configured to be responsive to activation of a second test instruction signal for simultaneously selecting said plurality of word lines and setting the voltage on said voltage transmission line at voltage of a second logic level in said first test mode operation, said second test instruction signal being activated prior to activation of said first test instruction signal.

2. The semiconductor memory device according to claim 1, wherein
   said test control circuit includes means for generating a plurality of internal operation control signals having activation timing thereof determined according to a plurality of externally supplied control signals, and said bit line precharge circuits, said sense amplifier circuits and word lines are driven according to said plurality of internal operation control signals.

3. The semiconductor memory device according to claim 2, wherein
   said test control circuit further includes means for generating an internal address signal specifying a word line according to said plurality of externally supplied control signals.

4. A semiconductor memory device comprising:
   a plurality of memory blocks each including a plurality of memory cells arranged in rows and columns;
   a plurality of word lines arranged corresponding to said rows and each connected to memory cells of a corresponding row;
   a plurality of pairs of bit lines provided corresponding to said columns and each connected to memory cells of a corresponding column,
   wherein
      each of the pair of bit lines includes first and second bit lines transmitting data signals complementary to each other in a normal access mode,
      each memory cell of each column in each of said plurality of memory blocks is connected to one of said first and second bit lines of a corresponding pair of bit lines, and the plurality of word lines includes a first word line connected to a memory cell connected to the first bit line and a second word line connected to a memory cell connected to the second bit line;

a plurality of sense amplifier groups each including a plurality of sense amplifier circuits, arranged corresponding to said plurality of memory blocks, each arranged to be shared by memory blocks adjacent to each other in a column direction, each of the sense amplifier circuits arranged corresponding to a column of a corresponding memory block and activated to sense and amplify data in a memory cell on a corresponding column;

a plurality of bit line isolation circuits arranged between each of the sense amplifier groups and each memory block and each activated to isolate a corresponding sense amplifier group from a corresponding memory block;

a plurality of bit line precharge circuit groups each including a plurality of bit line precharge circuits arranged corresponding to the columns of corresponding memory blocks, arranged to be shared by the memory blocks adjacent to each other in the column direction, each of the bit line precharge circuit groups being activated to transmit a voltage to the columns of a corresponding memory block; and a test control circuit for activating each of the bit line precharge circuits, inactivating said plurality of bit line isolation circuits and driving simultaneously, into selected state, a first predetermined number of word lines among said plurality of word lines in said plurality of memory blocks in a first test mode operation, and for inactivating said plurality of bit line precharge circuits, inactivating said plurality of bit line isolation circuits, driving simultaneously, into selected state, a second predetermined number of word lines among said plurality of word lines in said plurality of memory blocks, and activating said plurality of sense amplifier groups in a second test mode operation following the first test mode operation, wherein said test control circuit includes means configured for driving the first word lines into the selected state in response to activation of a first test instruction signal in said first test mode operation, means configured for setting said voltage transmitted by a voltage transmission line on a voltage transmission line at a voltage of a first logic level when said first test instruction signal is activated, and means configured to be responsive to activation of a second test instruction signal for simultaneously selecting said plurality of word lines in said plurality of memory blocks and setting the voltage on said voltage transmission line at a voltage of a second logic level in said first test mode operation, said second test instruction signal being activated prior to activation of said first test instructions signal.

5. The semiconductor memory device according to claim 4, wherein said test control circuit includes means for generating a plurality of internal operation control signals having activation timing thereof determined according to a plurality of externally supplied control signals, and the bit line precharge circuits, the sense amplifier circuits and word lines are driven according to said plurality of internal operation control signals.

6. The semiconductor memory device according to claim 4, wherein said test control circuit further includes means for generating an internal address signal specifying a word line according to said plurality of externally supplied control signals.

7. The semiconductor memory device according to claim 4, wherein said test control circuit includes means for simultaneously setting said plurality of memory blocks into a selected state according to an externally supplied control signal in said second test mode operation.

\* \* \* \* \*